(12) United States Patent
Iwata

(10) Patent No.: US 7,375,544 B2
(45) Date of Patent: May 20, 2008

(54) SEMICONDUCTOR APPARATUS HAVING LOGIC LEVEL DECISION CIRCUIT AND INTER-SEMICONDUCTOR APPARATUS SIGNAL TRANSMISSION SYSTEM

(75) Inventor: Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 439 days.

(21) Appl. No.: 10/623,559

(22) Filed: Jul. 22, 2003

(65) Prior Publication Data

US 2006/0023518 A1    Feb. 2, 2006

(30) Foreign Application Priority Data

Feb. 27, 2003   (JP)   ............... 2003-051360

(51) Int. Cl.
*H03K 19/003* (2006.01)
(52) U.S. Cl. ............... 326/11; 326/9; 365/196; 365/207; 365/208
(58) Field of Classification Search ............ 326/9, 326/11; 365/196, 207, 208
See application file for complete search history.

(56) References Cited

U.S. PATENT DOCUMENTS

| | | | |
|---|---|---|---|
| 5,349,302 A | | 9/1994 | Cooper |
| 5,519,662 A | * | 5/1996 | Ishibashi et al. ............ 365/207 |
| 5,815,452 A | * | 9/1998 | Shen ......................... 365/207 |
| 5,875,050 A | * | 2/1999 | Ota .......................... 398/202 |
| 6,151,150 A | * | 11/2000 | Kikuchi ...................... 398/209 |
| 6,473,280 B1 | * | 10/2002 | Buxton et al. ................ 361/18 |
| 6,625,057 B2 | * | 9/2003 | Iwata ........................ 365/158 |
| 2004/0199841 A1 | * | 10/2004 | Marr ......................... 714/731 |

FOREIGN PATENT DOCUMENTS

JP    3-263693    11/1991

OTHER PUBLICATIONS

R. Scheuerlein, et al., IEEE ISSCC Digest of Technical Papers, pp. 128-129 (and 94-95 and 409-410), "A 10NS Read and Write Non-Volatile Memory Array Using a Magnetic Tunnel Junction and FET Switch in Each Cell", Feb. 2000.
R. Crisp, et al., IEEE ISSCC Digest of Technical Papers, pp. 226-227 (and 176-177, 414-415 and 461), "Development of Single-Chip Multi-GB/s DRAMs", Feb. 7, 1997.

* cited by examiner

*Primary Examiner*—Vibol Tan
(74) *Attorney, Agent, or Firm*—Oblon, Spivak, McClelland, Maier & Neustadt, P.C.

(57) ABSTRACT

In a signal transmission system between a plurality of semiconductor apparatuses, a logic level decision circuit deciding a logic level of an input signal in accordance with which of two reference signals a signal level of the input signal is close to, by using two reference signals Vref1, Vref0 having a "1" level and a "0" level as reference signals for deciding the logic level of the input signal having a binary logic level, is used as an input receiver of the each semiconductor apparatus.

8 Claims, 14 Drawing Sheets

PARALLEL
(SMALL RESISTANCE)

INVERSELY PARALLEL
(LARGE RESISTANCE)

TO FIRST MRAM DATA REWRITE CONTROLLER

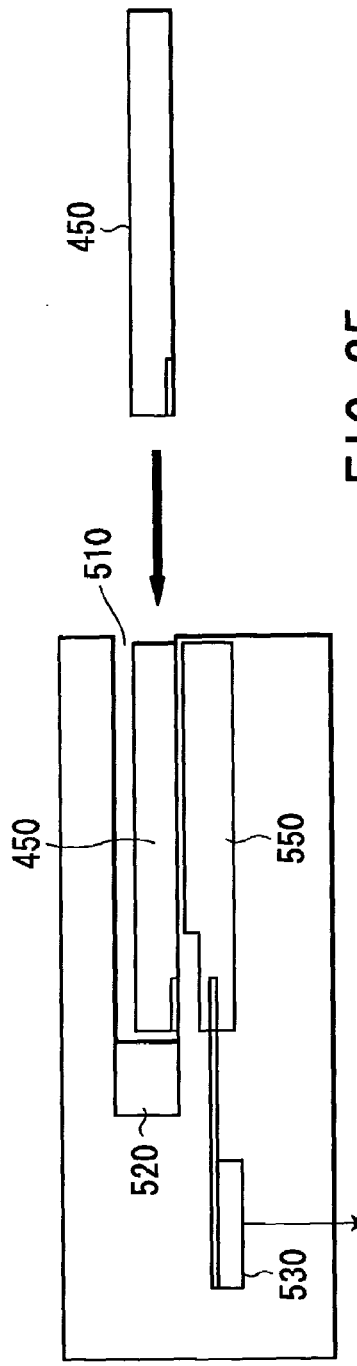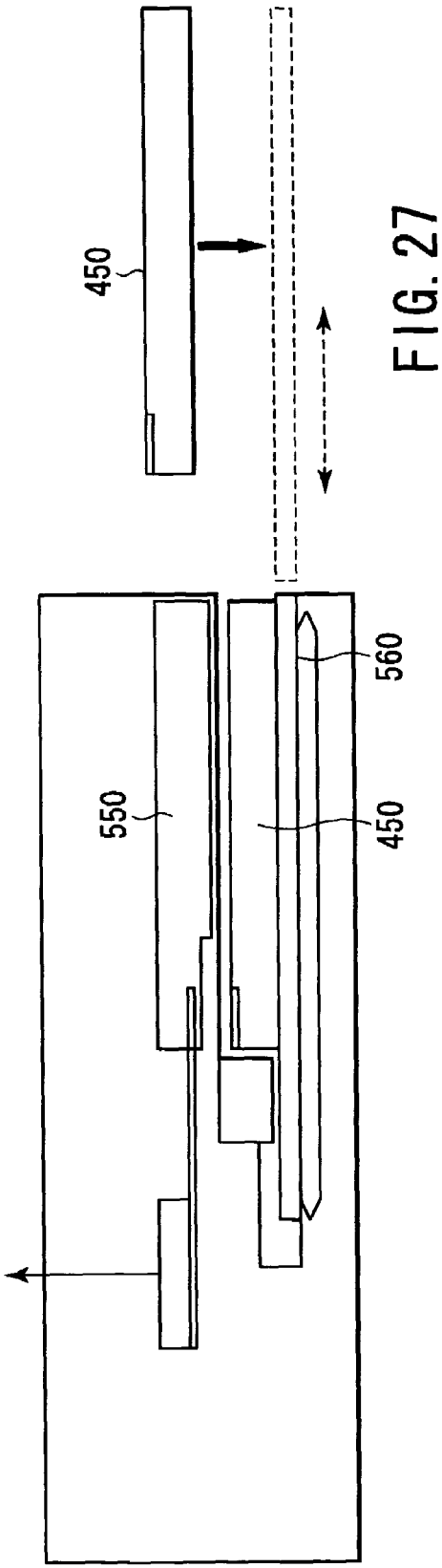

SEMICONDUCTOR APPARATUS HAVING LOGIC LEVEL DECISION CIRCUIT AND INTER-SEMICONDUCTOR APPARATUS SIGNAL TRANSMISSION SYSTEM

CROSS-REFERENCE TO RELATED APPLICATIONS

This application is based upon and claims the benefit of priority from the prior Japanese Patent Application No. 2003-051360, filed Feb. 27, 2003, the entire contents of which are incorporated herein by reference.

BACKGROUND OF THE INVENTION

1. Field of the Invention

The present invention relates to a semiconductor apparatus having a logic level decision circuit deciding the binary logic level of an input signal from the exterior or an input signal of the interior, and to an inter-semiconductor apparatus signal transmission system.

2. Description of the Related Art

The binary logic level of a signal processed at the interior of a digital semiconductor apparatus, such as a semiconductor memory apparatus, an MPU (Micro Processing Unit), or the like, is generally expressed by a voltage value. The binary logic level of a signal transmitted between these semiconductor apparatuses is expressed by a voltage value.

FIG. 1 shows one example of a conventional inter-semiconductor apparatus signal transmission system.

A plurality of semiconductor apparatuses 100 are provided at the signal transmission system. Address/data bus and control signal lines 11 are commonly connected to these plurality of semiconductor apparatuses 100. Moreover, a reference voltage Vref transmitted at a voltage supplying line 12 is commonly supplied to the respective semiconductor apparatuses 100. The reference voltage Vref has an intermediate value of the voltage of the logic "1" level and the voltage of the logic "0" level of a binary input signal.

FIG. 2 shows an input receiver provided in the respective semiconductor apparatuses 100 of FIG. 1. The input receiver 101 decides the logic level of an input signal Vin by using the reference voltage Vref. At this time, a malfunction easily arises as will be described hereinafter.

That is to say, in the semiconductor apparatus, due to the miniaturization and the high-integration of an MOS transistor provided at the interior thereof, the maximum value of the supplied voltage has been limited and has become small. Therefore, the power source voltage and the voltage difference of the two logic levels become small. As a result, the voltage difference between the reference voltage Vref, which is the intermediate value of the potentials of data "1" and data "0", and the signal voltage of data "1" or data "0" which the input receiver receives become small.

In such a situation, if there are power source noise at the time of operation in the inner circuit of the semiconductor apparatus, fluctuations in the ground level, and swinging due to reflection or the like of the input signal itself, it is easy for the input receiver to malfunction. Further, the reference voltage Vref supplied from the exterior of the semiconductor apparatus fluctuates in accordance with the coupling with the adjacent wiring on a board or in a module in which the semiconductor apparatus is packed. Fluctuations of the reference voltage Vref are a factor of malfunctioning of the input receiver.

On the other hand, in a semiconductor memory which has a plurality of memory cells and which has one input/output port, a sense amplifier circuit deciding the logic level of a reading signal from a memory cell conventionally uses an intermediate value of the voltage corresponding to data "1" and the voltage corresponding to data "0". In this case, if the reading signal has a small amplitude resulting from the weakness of the driving ability of the memory cell or the like, at the time of deciding it by the sense amplifier circuit, malfunctioning easily arises as described above.

That is to say, due to the semiconductor memory being made to be highly integrated and to have a large capacity, the load from the standpoint of the memory cell becomes large, and high-speed performance is also required. Therefore, there is the trend that the voltage difference between the input signal voltage received when the sense amplifier circuit starts the sensing operation and the reference voltage, or the current difference between the input signal current and the reference current, becomes small. This means that the number of memory cells whose data cannot be sensed increases if the sensitivity of the sense amplifier circuit does not vary in consideration of the manufacturing dispersion of the memory cells, and a deterioration of yield is brought about.

FIG. 3 and FIG. 4 respectively show specific examples of the conventional logic level decision circuit used as a sense amplifier circuit in the semiconductor memory.

In the logic level decision circuit, because an intermediate value of the reading current Iref1 or the reading voltage Vref1 from the memory cell of data "1" and the reading current Iref0 or the reading voltage Vref0 from the cell of data "0" is generated as a reference signal, the problems which were described above arise.

On the other hand, in recent years, a large number of elements storing data in accordance with new principles have been proposed. One of them is a magnetic tunnel junction (hereinafter, MTJ) which carries out storing of "1"/"0" data by using the tunneling magneto resistive effect. A magnetic random access memory (MRAM), in which a plurality of magnetic memory cells structured by using the MTJ elements are arranged in a matrix form and which has non-volatility and high-speed performance, has been proposed.

An MR ratio, which is an index in which a rate of change in the resistances of the MTJ element, i.e., the variation of the resistances of data "1" and "0", is divided by the resistance in the "0" state, is about 20% to 40%. Accordingly, the difference between the signal level read from the MTJ element of data "1" and the signal level read from the MTJ element of data "0" is only about 20 percent to 30 percent.

Because the MTJ element is structured such that current flows via a tunnel barrier film, a relationship is established in which the change in the value of resistance of the MRJ element logarithmically increases in accordance with the increase of the film thickness of the tunnel barrier film. The film thickness of the tunnel barrier film of MTJ elements which are currently reported is about several nm, and the dispersion in the resistances between different MTJ elements is accelerated even more in accordance with the dispersion in the film thickness of the tunnel barrier film.

Accordingly, if a method, in which an intermediate level of data "1" and "0" is used as a reference voltage or a reference current which is input to a sense amplifier circuit, is used, when a signal difference becomes small due to the dispersion in the resistances of the MTJ element, a malfunction of reading is brought about, and deterioration of yield is brought about. From the standpoint of making the MRAM to have a large capacity, it is not preferable to form a structure in which two MTJ elements store one bit in order to prevent such a malfunction of reading.

As described above, the conventional logic level decision circuit used for an input receiver or a sense amplifier circuit has the problems that malfunctioning easily arises due to dispersion in the reference levels for detecting an input signal, and the like, and it is preferable to resolve such problems.

BRIEF SUMMARY OF THE INVENTION

According to one aspect of the present invention, there is provided a semiconductor apparatus having a logic level decision circuit, the logic level decision circuit comprises: a first comparison circuit which compares an input signal with a first reference signal corresponding to logic "1" level, and which outputs a first differential signal; a second comparison circuit which compares the input signal with a second reference signal corresponding to logic "0" level, and which outputs a second differential signal; and a third comparison circuit which compares output of the first comparison circuit and output of the second comparison circuit, and which decides a logic level of the input signal.

According to another aspect of the present invention, there is provided a signal transmission system which transmits and receives binary logic signals between a plurality of semiconductor apparatuses, the plurality of semiconductor apparatuses respectively have an input receiver that decides the logic level of an input signal from an exterior, and a first reference signal corresponding to a logic "1" level of the input signal and a second reference signal corresponding to a logic "0" level are supplied as reference signals for logic level decision to the respective input receivers.

BRIEF DESCRIPTION OF THE SEVERAL VIEWS OF THE DRAWING

FIG. 25 is a side view of the transfer device in FIG. 24;

FIG. 27 is a side view of a transfer device of slide type for transferring data on the MRAM card in FIG. 23.

DETAILED DESCRIPTION OF THE INVENTION

Hereinafter, the present invention will be described in detail by using embodiments with reference to the drawings.

Figure 5:
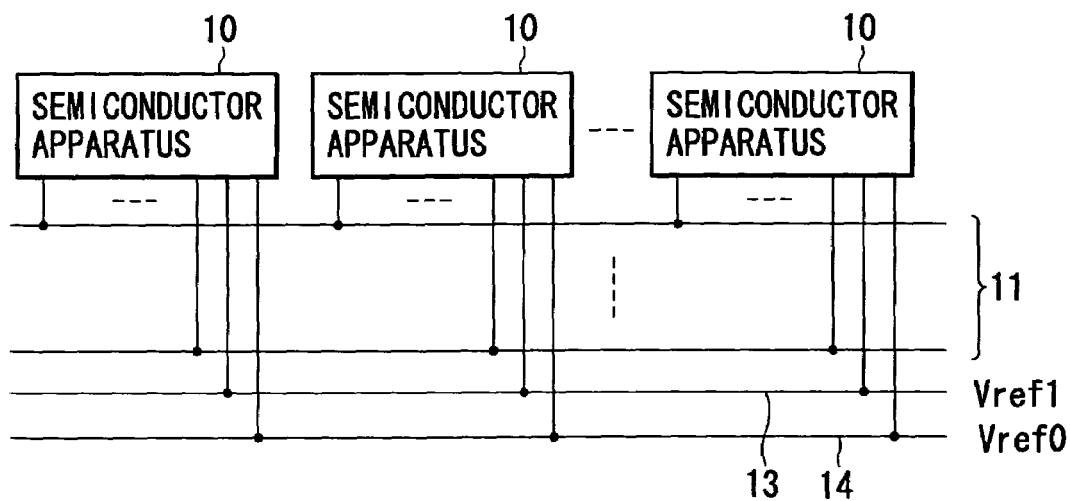
FIG. 5 is a block diagram showing a structure of a signal transmission system according to a first embodiment of the present invention.

FIG. 5 shows a signal transmission system according to a first embodiment of the present invention. A plurality of semiconductor apparatuses 10 respectively including, for example, semiconductor memories, MPUs, or the like, are provided at the signal transmission system. Address/data bus control signal lines 11 and first and second voltage supplying lines 13, 14 are commonly connected to these plurality of semiconductor apparatuses 10. A plurality of input receivers serving as logic level decision circuits are respectively provided at the interiors of the plurality of semiconductor apparatuses 10. An input signal having the binary logic, and reference voltages Vref1 and Vref0 which are transmitted at the first and second voltage supplying lines 13, 14, are respectively supplied to these respective input receivers. The two reference voltages Vref1 and Vref0 are voltages respectively corresponding to the logic "1" and "0" levels of the input signal.

The respective input receivers serving as the logic level decision circuits provided in the respective semiconductor apparatuses 10 decide the logic level of the input signal in accordance with which of the two reference voltages Vref1 and Vref0 the voltage level of the input signal is close to. At this time, the potential difference of the two input voltages which will be objects of voltage comparison is twice the potential difference between the input signal and the reference voltage in a conventional logic level decision circuit. Accordingly, an input receiver which is strongly resistant to noise can be realized.

Figure 6:
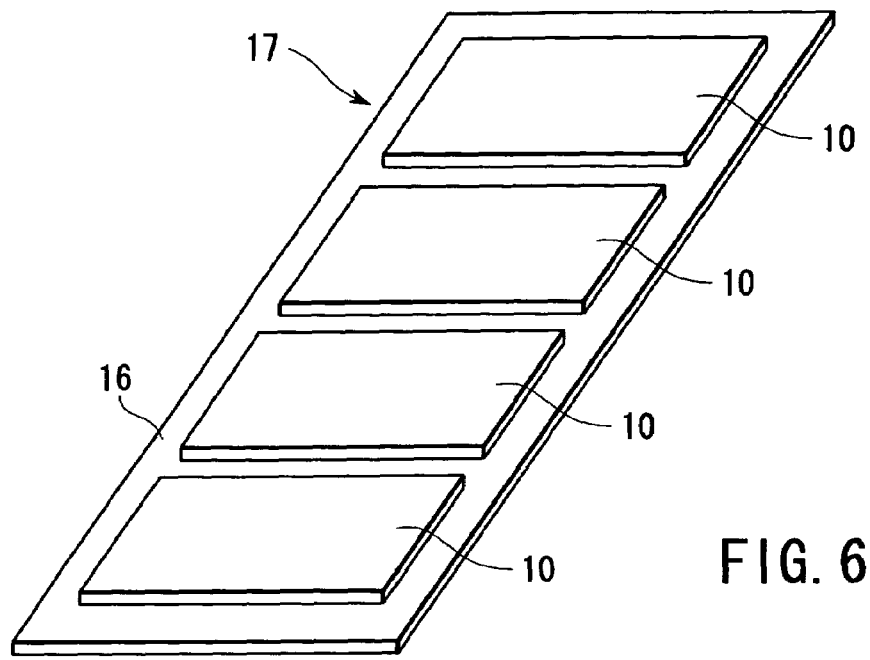
FIG. 6 is a perspective view of a semiconductor module in which a plurality of semiconductor memories in the signal transmission system of FIG. 5 are mounted on the same wiring substrate.

Note that, for example, as shown in FIG. 6, the above-described signal transmission system may be a semiconductor module in which a plurality of the semiconductor memory apparatuses 10 are packed on a same wiring board 16, i.e., a memory module 17.

Figure 7:
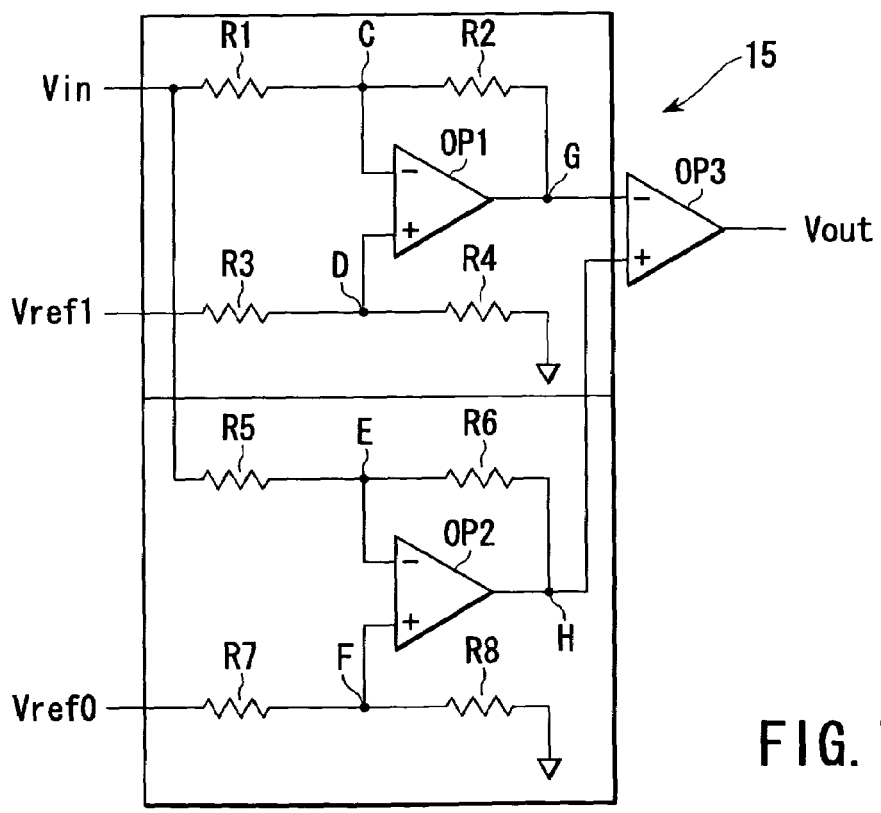
FIG. 7 is a circuit diagram showing a theoretical structure of a logic level decision circuit provided in the semiconductor apparatus of FIG. 5.

FIG. 7 shows a theoretical structure of a logic level decision circuit 15 as the input receiver provided in the respective semiconductor apparatuses 10 shown in FIG. 5.

In FIG. 7, Vin is an input signal voltage, and Vref1 is the first reference voltage corresponding to the logic "1" level of the input signal, and Vref0 is the second reference voltage corresponding to the logical value "0" of the input signal.

A signal input node to which the input signal voltage Vin is input is connected to an inverse input node (−) of a first operational amplifier OP1 via a resistive element R1. A feedback resistive element R2 is connected between the inverse input node (−) of the first operational amplifier OP1 and an output node G.

A first reference signal input node, to which the first reference voltage Vref1 is input, is grounded serially via resistive elements R3 and R4. A serial-connection note D of the resistive elements R3 and R4 is connected to a non-inverse input node (+) of the first operational amplifier OP1.

The signal input node is further connected to an inverse input node (−) of a second operational amplifier OP2 via a resistive element R5. A feedback resistive element R6 is connected between the inverse input node (−) of the second operational amplifier OP2 and an output node H.

A second reference signal input node, to which the second reference voltage Vref0 is input, is grounded serially via resistive elements R7 and R8. A serial-connection note F of the resistive elements R7 and R8 is connected to a non-inverse input node (+) of the second operational amplifier OP2.

Moreover, the output node G of the first operational amplifier OP1 and the output node H of the second operational amplifier OP2 are correspondingly connected to an inverse input node (−) and a non-inverse input node (+) of a third operational amplifier OP3. A logic level decision output Vout is obtained at the output node of the third operational amplifier OP3.

In the logic level decision circuit having the above-described structure, the logic level of an input signal is decided in accordance with which of the two reference voltages Vref1 and Vref0 the voltage level of the input signal is close to. That is to say, in the circuit of FIG. 7, assuming that the values of the resistances of the resistive elements R1 to R8 are the same, because the electric potential of the node D is Vref1/2, the electric potential of a connection node C of the resistive elements R1 and R2 is the same Vref1/2 due to the feedback of the electric potential of the output node G of the first operational amplifier OP1. Accordingly, the node G becomes (Vref1/2)−(Vin−Vref1/2)=Vref1−Vin, and a voltage difference of Vin and Vref1 (first voltage difference) is output.

On the other hand, because the electric potential of the node F is Vref0/2, the electric potential of a connection node E of the resistive elements R5 and R6 is the same Vref0/2 due to the feedback of the electric potential of the output node H of the second operational amplifier OP2. Accordingly, the node H becomes (Vref0/2)−(Vin−Vref0/2)=Vref0−Vin, and a voltage difference of the Vin and the Vref0 (second voltage difference) is output.

Further, the first voltage difference and the second voltage difference are maintained as is as potential differences without being converted into digital values, and are compared at the third operational amplifier OP3, and are converted into binary data.

In this case, the first voltage difference and the second voltage difference are respectively greater than the voltage difference between the signal voltage Vin and the intermediate voltage (Vref1+Vref0)/2 of the logic "1" and "0" levels, and the voltage difference of the two inputs of the third operational amplifier OP3 is (Vin−Vref0)−(Vref1−Vin)=2×Vin−Vref1+Vref0. That is to say, the voltage difference is greater than the voltage difference (Vin−(Vref1+Vref0)/2) of the two inputs of a conventional logic level decision circuit, and becomes twice this value. Therefore, the margin of the deciding operation becomes large.

Note that, when the logic level decision circuit 15 of FIG. 7 is used as a sense amplifier circuit of the semiconductor memory, it is decided which of the levels of the two reference voltages Vref1, Vref0 the level of a bit line signal (input signal) read from the memory cell is close to. In this case, the reference voltages Vref1, Vref0 are generated by respectively using the reference memory cell which stored "1" data and the reference memory cell which stored "0" data.

Next, various embodiments of the logic level decision circuit will be described.

Figure 8:
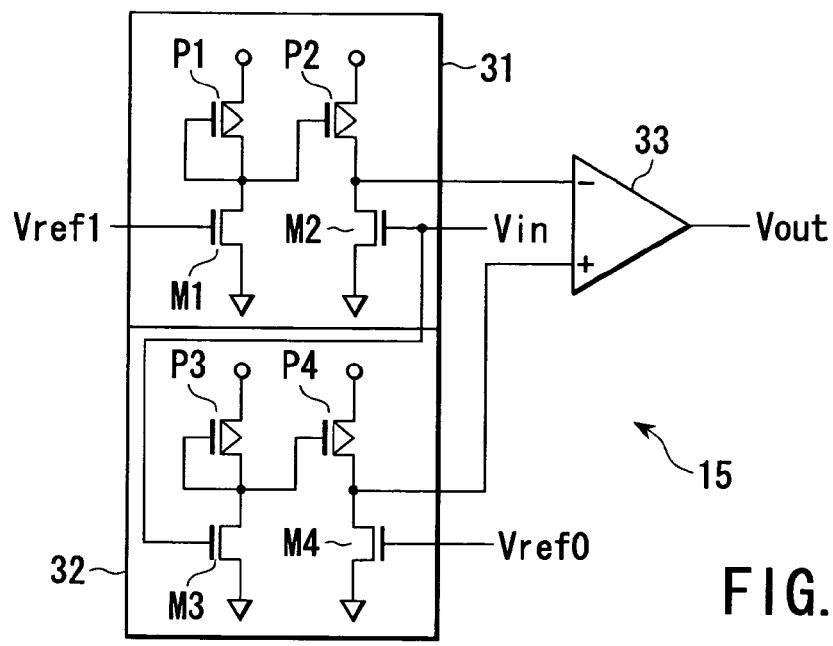
FIG. 8 is a circuit diagram of a logic level decision circuit of a second embodiment of the present invention.

FIG. 8 shows a structure of a logic level decision circuit according to a second embodiment of the present invention.

The logic level decision circuit 15 is an example when the input signal is the voltage Vin, and is used as an input receiver or a sense amplifier circuit.

In FIG. 8, a PMOS current mirror type first voltage comparison circuit 31 has an NMOS transistor M1 at which the reference voltage Vref1 is input to the gate thereof, an NMOS transistor M2 at which the input signal voltage Vin is input to the gate thereof, and PMOS transistors P1, P2 which are current-mirror-connected. A PMOS current mirror type second voltage comparison circuit 32 has an NMOS transistor M3 at which the input signal voltage Vin is input to the gate thereof, an NMOS transistor M4 at which the reference voltage Vref0 is input to the gate thereof, and PMOS transistors P3, P4 which are current-mirror-connected. Note that all of the driving abilities of the above-described PMOS transistors P1 to P4 for load are made to be the same, and all of the driving abilities of the NMOS transistors M1 to M4 for input are made to be the same.

The respective outputs of the above-described two voltage comparison circuits 31, 32 are input to a differential amplifier circuit 33. In this case, in the first voltage comparison circuit 31, the electric potential of the inverting input terminal (−) of the differential amplifier circuit 33 is proportional to a current difference between the current made to flow by the NMOS transistor M1 at which the reference voltage Vref1 is input to the gate thereof, and the current made to flow by the NMOS transistor M2 at which the input signal voltage Vin is input to the gate thereof. That is to say, a voltage difference corresponding to the current difference arises by electric charges being charged at a parasitic capacitor including a gate capacitance of a MOS transistor in the differential amplifier circuit 33 connected to the inverting input terminal (−) of the differential amplifier circuit 33, or the like.

Further, in the second voltage comparison circuit 32, the electric potential of the non-inverting input terminal (+) of the differential amplifier circuit 33 is proportional to the current difference between the current made to flow by the NMOS transistor M4 at which the reference voltage Vref0 is input to the gate thereof, and the current made to flow by the NMOS transistor M3 at which the input signal voltage Vin is input to the gate thereof. That is to say, a voltage difference corresponding to the current difference arises by electric charges being charged at a parasitic capacitor including a gate capacitance of a MOS transistor in the differential amplifier circuit 33 connected to the non-inverting input terminal of the differential amplifier circuit 33, or the like.

Figure 9:
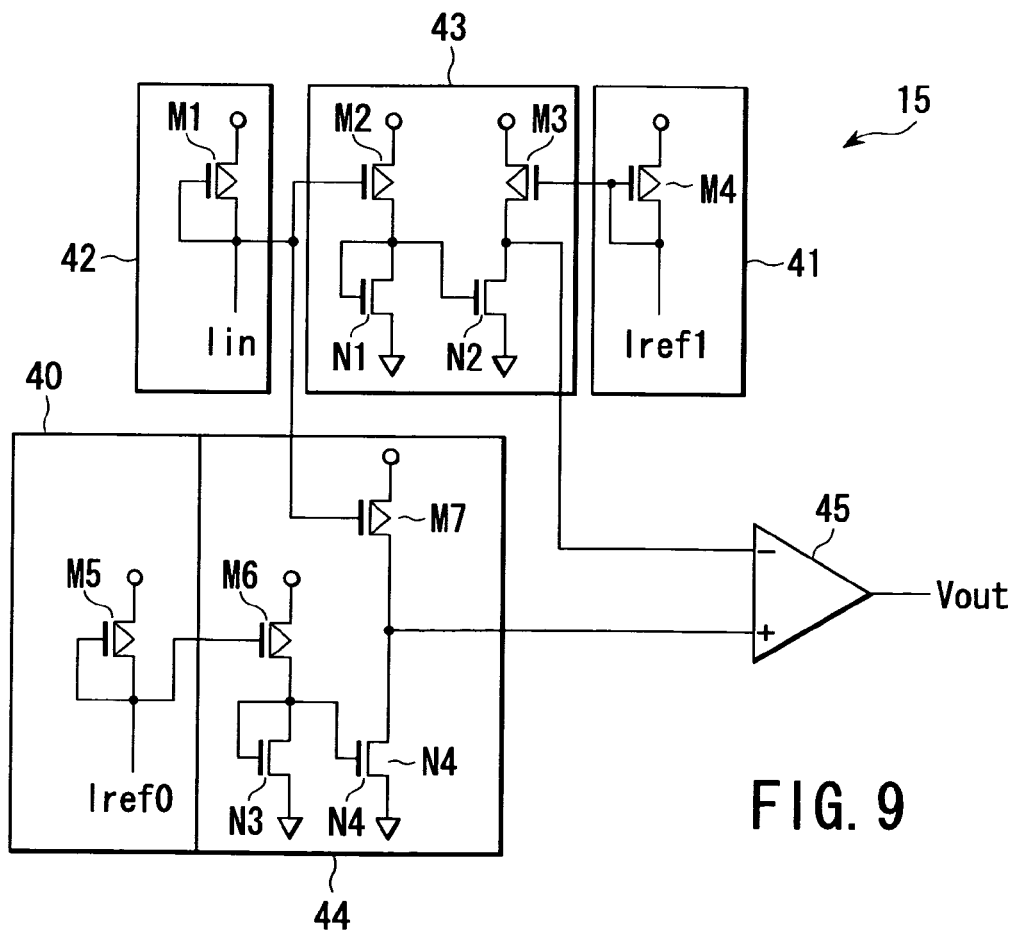
FIG. 9 is a circuit diagram of a logic level decision circuit of a third embodiment of the present invention.

FIG. 9 shows a logic level decision circuit according to a third embodiment of the present invention.

The logic level decision circuit 15 is an example when the input signal is the current Iin, and is used as a sense amplifier circuit.

In FIG. 9, the reference current Iref0 corresponding to the logic "0" level is input to an electric current input circuit 40. The reference current Iref1 corresponding to the logic "1" level is input to an electric current input circuit 41. The input signal current Iin is input to an electric current input circuit 42. Reference numeral 43 denotes an NMOS current mirror type first current comparison circuit, and reference numeral 44 denotes an NMOS current mirror type second current comparison circuit, and reference numeral 45 denotes a differential amplifier circuit.

The current input circuit 42 includes the PMOS transistor M1 in which the gate and the source are connected to one another due to the source and the drain being connected to one another between the power source voltage node and the input node of the input signal current Iin.

The current input circuit 41 includes the PMOS transistor M4 in which the gate and the source are connected to one another due to the source and the drain being connected to one another between the power source voltage node and the input node of the reference current Iref1. The current input circuit 40 includes the PMOS transistor M5 in which the gate and the source are connected to one another due to the source and the drain being connected to one another between the power source voltage node and the input node of the reference current Iref0.

The first current comparison circuit 43 has a PMOS transistor M2 whose gate is connected to the gate of the PMOS transistor M1, and which is driven by the gate potential of the PMOS transistor M1, a PMOS transistor M3 whose gate is connected to the gate of the PMOS transistor M4, and which is driven by the gate potential of the PMOS transistor M4, and two NMOS transistors N1, N2 which are current-mirror-connected and which function as the load transistors of the above-described two PMOS transistors M2, M4. The first current comparison circuit 43 outputs the current difference between the input signal current Iin and the reference current Iref1.

The second current comparison circuit 44 has a PMOS transistor M7 whose gate is connected to the gate of the PMOS transistor M1, and which is driven by the gate potential of the PMOS transistor M1, a PMOS transistor M6 whose the gate is connected to the gate of the PMOS transistor M5, and which is driven by the gate potential of the PMOS transistor M5, and two NMOS transistors N3, N4 which are current-mirror-connected and which function as the load transistors of the above-described two PMOS transistors M6, M7. The second current comparison circuit 44 outputs the current difference between the input signal current Iin and the reference current Iref0.

Note that all of the driving abilities of the above-described PMOS transistors M1 to M7 for input are the same, and all of the driving abilities of the NMOS transistors N1 to N4 for load are the same.

The respective outputs of the above-described first and second current comparison circuits 43, 44 are input to the differential amplifier circuit 45. In this case, the electric potential of the inverting input terminal (−) of the differential amplifier circuit 45 is proportional to the output current of the first current comparison circuit 43, i.e., the current difference between the current Iin and the current Iref1. That is to say, a voltage difference corresponding to the current difference arises by electric charges being charged by the output current of the first current comparison circuit 43, at a parasitic capacitor including a gate capacitance of the internal MOS transistor connected to the inverting input terminal of the differential amplifier circuit 45, or the like.

Further, the electric potential of the non-inverting input terminal (+) of the differential amplifier circuit 45 is proportional to the output current of the second current comparison circuit 44, i.e., the current difference between the current Iin and the current Iref0. That is to say, a voltage difference corresponding to the current difference arises by the electric charges being charged by the second current comparison circuit 44, at a parasitic capacitor including a gate capacitance of the internal MOS transistor connected to the non-inverting input terminal (+) of the differential amplifier circuit 45, or the like.

Figure 10:
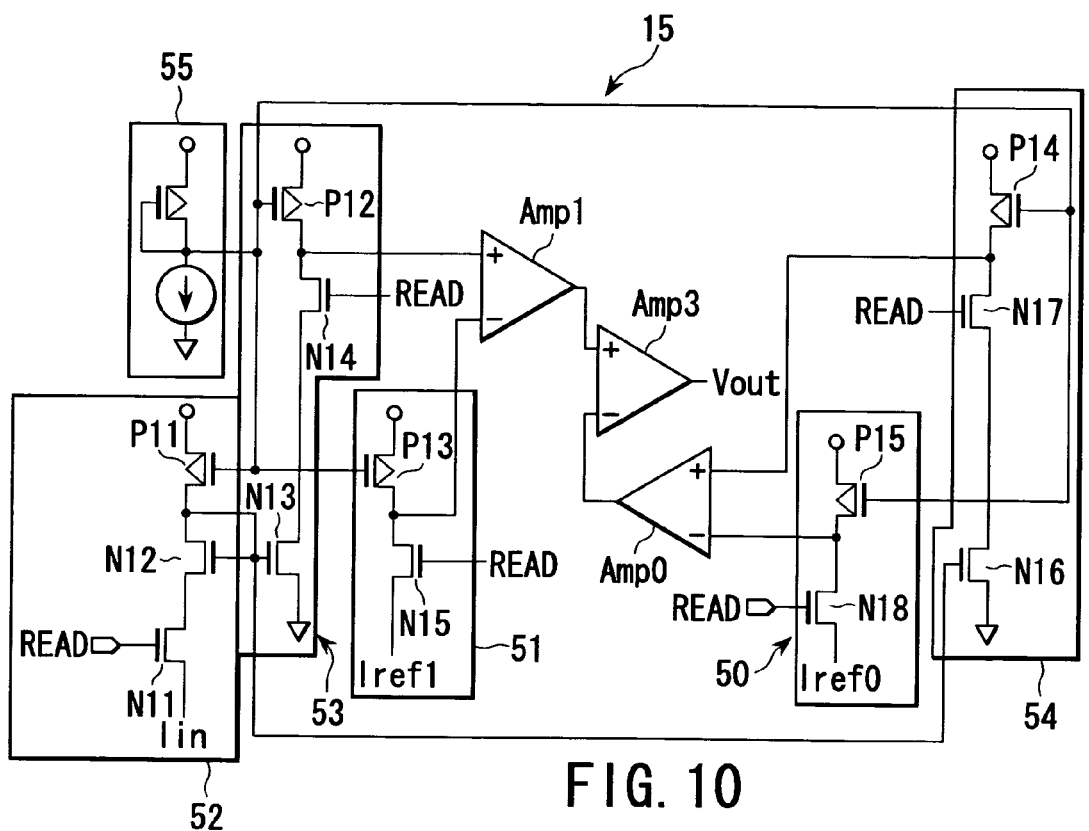
FIG. 10 is a circuit diagram of a logic level decision circuit of a fourth embodiment of the present invention.

FIG. 10 shows a configuration of a logic level decision circuit according to a fourth embodiment of the present invention.

Figure 1:
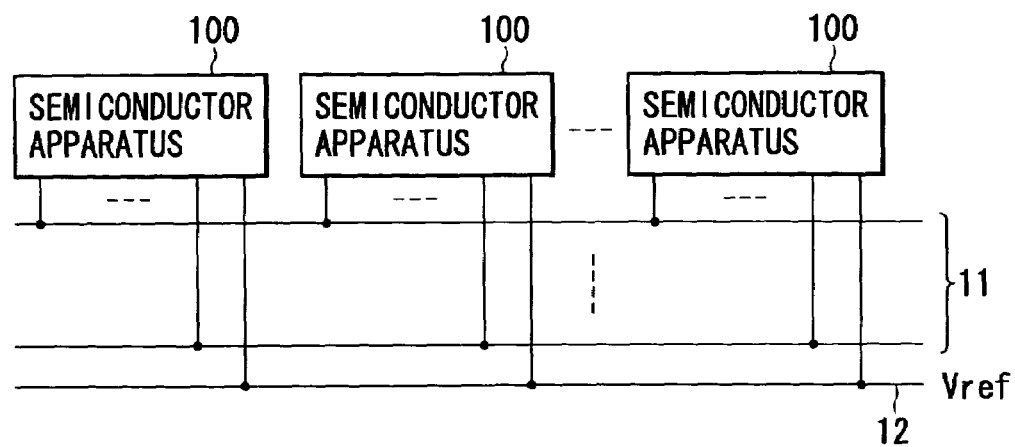
FIG. 1 is a block diagram showing an example of a conventional inter-semiconductor apparatus signal transmission system.
Figure 2:
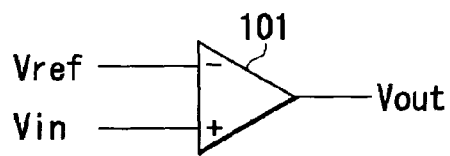
FIG. 2 is a block diagram of a conventional input receiver provided at the semiconductor apparatus of FIG. 1.
Figure 3:
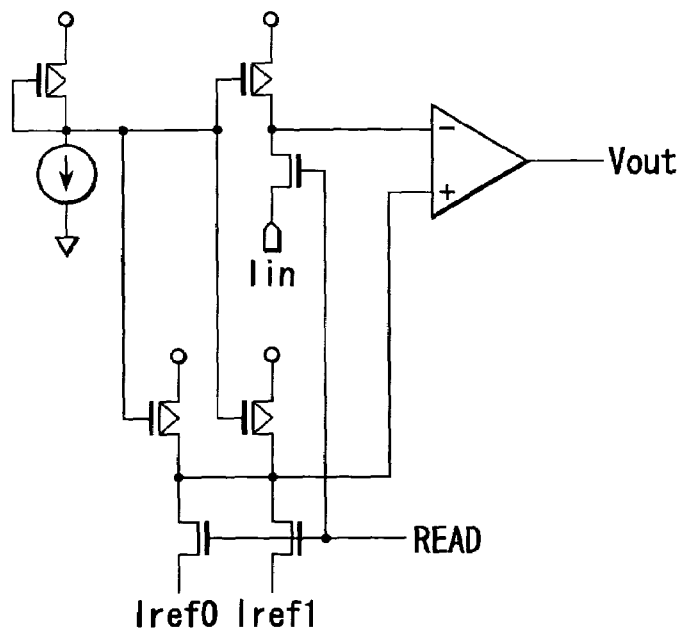
FIG. 3 is a circuit diagram showing a specific structure of the input receiver of FIG. 2.

The logic level decision circuit 15 is an improved example corresponding to the conventional example shown in FIG. 3, and is an example when the input signal is the current in the same way as in the logic level decision circuit described above with reference to FIG. 9.

In the logic level decision circuit shown in FIG. 10, a current input circuit 52 has a PMOS transistor P11 for load in which the current is prescribed by a current source circuit 55, and two NMOS transistors N11, N12 which are serially connected to the PMOS transistor P11. Further, the current input circuit 52 makes the input current Iin flow at the NMOS transistor N12 via the NMOS transistor Nin controlled so as to be activated by a control signal READ. A first NMOS current mirror circuit 53 copies the input current Iin flowing in the current input circuit 52. The first NMOS current mirror circuit 53 has an NMOS transistor N13 which is current-mirror-connected to the NMOS transistor N12, a PMOS transistor P12 for load, and an NMOS transistor N14 which is inserted between the NMOS transistor N13 and PMOS transistor P12, and which is controlled so as to be activated by the control signal READ.

The current input circuit 51 makes the reference current Iref1 of the logic "1" level flow, and has an NMOS transistor N15 controlled so as to be activated by the control signal READ, and a PMOS transistor P13 for load in which the current is prescribed by the current source circuit 55.

In a first differential amplifier Amp1, an output potential of the first NMOS current mirror circuit 53 is input to a non-inverting input terminal (+) thereof, and an output potential of the current input circuit 51 is input to an inverting input terminal (−) thereof. That is to say, in the first differential amplifier Amp1, a voltage corresponding to the difference between the supply current of the current source circuit 55 and the input signal current Iin is input to the non-inverting input terminal thereof, and a voltage corresponding to the difference between the supply current of the current source circuit 55 and the reference current Iref1 is input to the inverting input terminal thereof, and a voltage difference corresponding to the difference of the levels of the both inputs is output.

A second NMOS current mirror circuit 54 copies the input current Iin flowing in the current input circuit 52, and has an NMOS transistor N16 which is current-mirror-connected to the NMOS transistor N12, a PMOS transistor P14 for load, and an NMOS transistor N17 which is inserted between the NMOS transistor N16 and PMOS transistor P14, and which is controlled so as to be activated by the control signal READ.

The current input circuit 50 makes the reference current Iref0 of the logic "0" level flow via an NMOS transistor N18 controlled so as to be activated by the control signal READ, and has a PMOS transistor P15 for load in which a current is prescribed by the current source circuit 55 in addition to the NMOS transistor N18.

In a second differential amplifier Amp0, an output potential of the second NMOS current mirror circuit 54 is input to a non-inverting input terminal (+) thereof, and an output potential of the current input circuit 50 is input to an inverting input terminal (−) thereof. That is to say, in the second differential amplifier Amp0, a voltage corresponding to the difference between the supply current of the current source circuit 55 and the input signal current Iin is input to the non-inverting input terminal, and a voltage corresponding to the difference between the supply current of the current source circuit 55 and the reference current Iref0 is input to the inverting input terminal, and a voltage difference corresponding to the difference of the levels of the both inputs is output.

In a third differential amplifier Amp3, respective outputs of the first and second differential amplifier circuits Amp1, Amp0 are correspondingly input to the non-inverting input terminal (+) and the inverting input terminal (−), and the both inputs are compared and converted into binary data.

In the logic level decision circuit having the above-described structure, due to the control signal READ being activated, the input signal current Iin and the reference current Iref1 corresponding to data "1" are input to the first differential amplifier circuit Amp1, and a current difference corresponding to the difference of the levels of the both is output. Further, due to the control signal READ being activated, the input signal current Iin and the reference current Iref0 corresponding to data "0" are input to the second differential amplifier circuit Amp0, and a current difference corresponding to the difference of the levels of the both is output. Further, in the third differential amplifier circuit Amp3, two voltage differences which are proportional to the respective output currents of the first and second differential amplifier circuits Amp1, Amp0 are compared.

Note that there is no need for the first differential amplifier Amp1 and the second differential amplifier Amp0 to have an amplitude of Rail-to-Rail as an output, and the operation of outputting the input difference is important. Accordingly, a current mirror type current comparison circuit having a simple structure such as, for example, the first and second current comparison circuits 43, 44 shown in FIG. 9 can be used.

Figure 11:
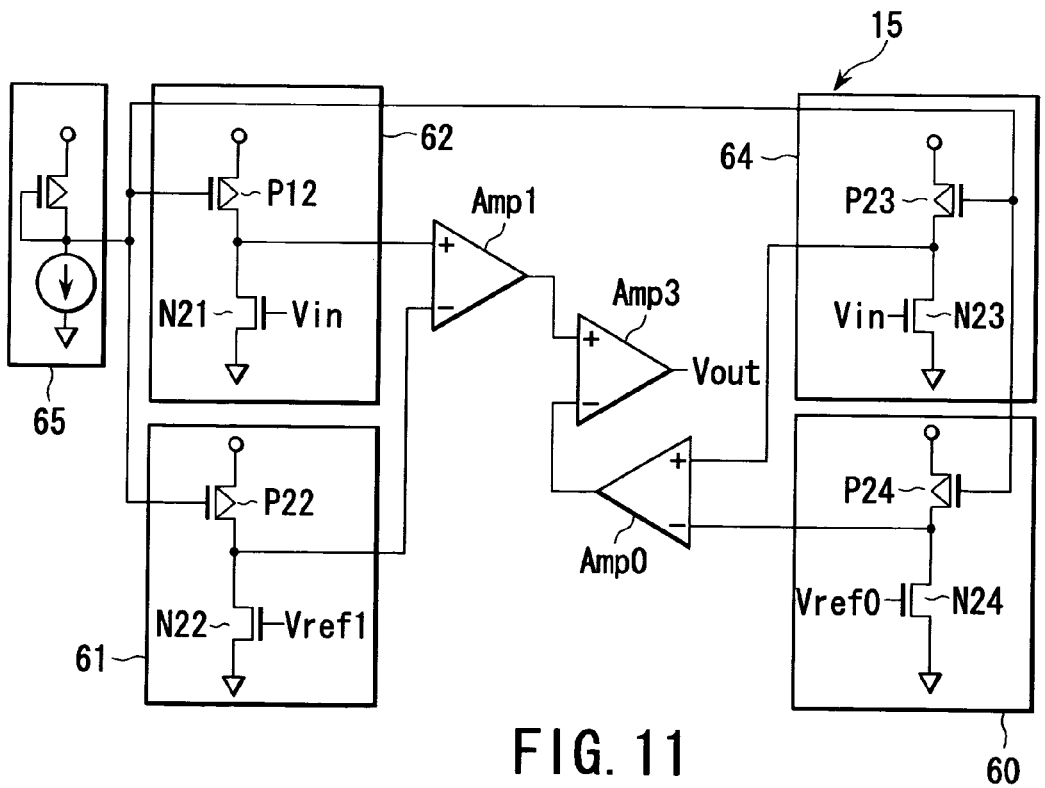
FIG. 11 is a circuit diagram of a logic level decision circuit of a fifth embodiment of the present invention.

FIG. 11 shows a logic level decision circuit of a fifth embodiment of the present invention.

Figure 4:
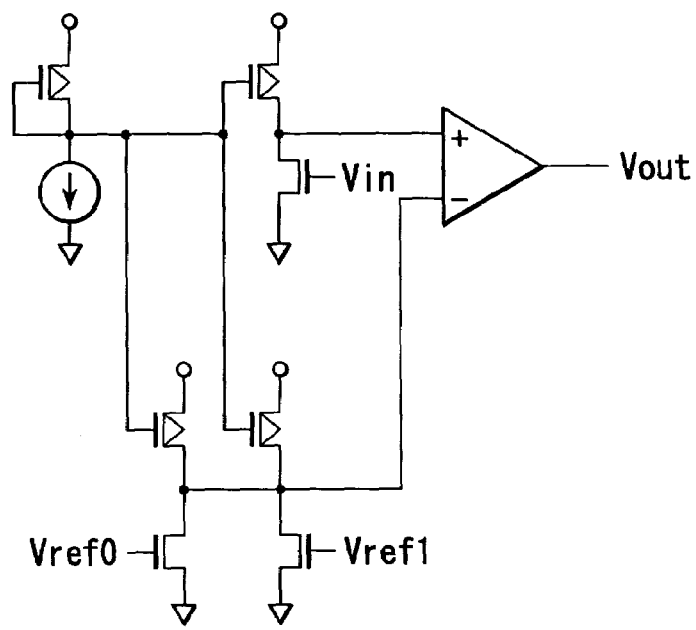
FIG. 4 is a circuit diagram showing a specific structure which is different from that of FIG. 3, of the input receiver of FIG. 2.

The logic level decision circuit 15 is an improved example corresponding to the conventional example shown in FIG. 4, and is an example when the input signal is a voltage in the same way as in the logic level decision circuit described above with reference to FIG. 8.

In the logic level decision circuit shown in FIG. 11, a voltage input circuit 62 has an NMOS transistor N21 at which the input signal voltage Vin is input to the gate thereof, and a PMOS transistor P12 for load in which the current is prescribed by a current source circuit 65. A voltage input circuit 61 has an NMOS transistor N22 at which the reference voltage Vref1 is input to the gate thereof, and a PMOS transistor P22 for load in which the current is prescribed by the current source circuit 65.

In the first differential amplifier Amp1, an output potential of the voltage input circuit 62 is input to the non-inverting input terminal (+) thereof, and an output potential of the voltage input circuit 61 is input to the inverting input terminal (−) thereof. That is to say, in the first differential amplifier Amp1, a voltage corresponding to the difference between the supply current of the current source circuit 65 and the driving current of the NMOS transistor N21 whose gate voltage is Vin is input to the non-inverting input terminal thereof, and a voltage corresponding to the difference between the supply current of the current source circuit 65 and the driving current of the NMOS transistor N22 whose gate voltage is Vref1 is input to the inverting input terminal thereof, and a voltage difference corresponding to the difference of the levels of the both inputs is output.

A voltage input circuit 64 has an NMOS transistor N23 at which the input signal voltage Vin is input to the gate thereof, and a PMOS transistor P23 for load in which the current is prescribed by the current source circuit 65. A voltage input circuit 60 has an NMOS transistor N24 at which the reference voltage Vref0 is input to the gate thereof, and a PMOS transistor P24 for load in which the current is prescribed by the current source circuit 65.

In the second differential amplifier Amp0, an output potential of the voltage input circuit 64 is input to the non-inverting input terminal (+) thereof, and an output potential of the voltage input circuit 60 is input to the inverting input terminal (−) thereof. That is to say, in the second differential amplifier Amp0, a voltage corresponding to the difference between the supply current of the current source circuit 65 and the driving current of the NMOS transistor N23 whose gate voltage is Vin is input to the non-inverting input terminal thereof, and a voltage corresponding to the difference between the supply current of the current source circuit 65 and the driving current of the NMOS transistor N24 whose gate voltage is Vref0 is input to the inverting input terminal thereof, and a voltage difference corresponding to the difference of the levels of the both inputs is output.

In the third differential amplifier Amp3, respective outputs of the first and second differential amplifier circuits Amp1, Amp0 are correspondingly input to the non-inverting input terminal (+) thereof and the inverting input terminal (−) thereof, and the both inputs are compared and converted into binary data.

In the logic level decision circuit having the above-described structure, the input signal voltage Vin and the reference voltage Vref1 corresponding to data "1" are input to the first differential amplifier circuit Amp1, and a current difference corresponding to the difference of the levels of the both is output. Further, the input signal voltage Vin and the reference voltage Vref0 corresponding to data "0" are input to the second differential amplifier circuit Amp0, and a current difference corresponding to the difference of the levels of the both is output. Further, in the third differential amplifier circuit Amp3, respective output voltages of the first and second differential amplifier circuits Amp1, Amp0 are compared.

Note that there is no need for the first differential amplifier Amp1 and the second differential amplifier Amp0 to have an amplitude of Rail-to-Rail as the output, and the operation of outputting the input difference is important. Accordingly, a current mirror type comparison circuit having a simple structure such as, for example, the first and second current comparison circuits 31, 32 shown in FIG. 7 can be used as the first and second differential amplifier circuits Amp1, Amp0.

In the respective embodiments of the second to fifth embodiments described above, it is preferable to set the reference voltage Vref1 or the reference current Iref1, and the reference voltage Vref0 or the reference current Iref0 as follows in order to increase the operation margin.

That is to say, with respect to the magnitudes of the actual voltage and current corresponding to the logic levels, when the input level of data "1" (the voltage Vin1 or the current Iin1) is greater than the input level of data "0" (the voltage Vin0 or the current Iin0), it is preferable to set Vref1 or Iref1 to a value which is greater than the maximum value of the distribution of the input level of data "1" (the voltage Vin1 or the current Iin1), and to set Vref0 or Iref0 to a value which is less than the minimum value of the distribution of the input level of data "0" (the voltage Vin0 or the current Iin0).

In contrast to the above, with respect to the magnitudes of the actual voltage and current corresponding to the logic levels, when the input level of data "0" (the voltage Vin0 or the current Iin0) is greater than the input level of data "1" (the voltage Vin1 or the current Iin1), it is preferable to set Vref1 or Iref1 to a value which is less than the minimum value of the distribution of the input level of data "1" (the voltage Vin1 or the current Iin1), and to set Vref0 or Iref0 to a value which is greater than the maximum value of the distribution of the input level of data "0" (the voltage Vin0 or the current Iin0).

Note that, in order to match a parasitic resistance and a parasitic capacitance of the memory cell in the memory cell array, there are cases in which the circuit generating a reference voltage or a reference current provides a reference memory cell and generates the reference voltage or reference current. In this case, the reference cell does not always satisfy the above-described conditions. However, it is good that a circuit which converts the voltage/current is provided in front of the sense amplifier circuit so as to satisfy the above-described conditions.

Next, a logic level decision circuit according to a sixth embodiment of the present invention will be described.

The circuit structure of the logic level decision circuit according to the sixth embodiment is the same as the voltage input type circuit shown in FIG. 8. However, as compared with the voltage input type logic level decision circuit shown in FIG. 8, the reference voltages Vref1, Vref0 are set as follows in order to increase the operation margin.

That is to say, when the reference voltage Vref1 of data "1" is greater than the reference voltage Vref0 of data "0", in the two voltage comparison circuits 31, 32, all of the driving abilities of the PMOS transistors P1 to P4 for load are the same in the same way as in the circuit of FIG. 8. However, the driving abilities of the NMOS transistors M1, M2, M3, M4 for input are set to the relationship of M1>M2=M3>M4. The degree of the difference of the driving abilities is determined in accordance with the distribution state of the reference cell of data "1" and the "1" of the data cell, and the distribution state of the reference cell of data "0" and the "0" of the data cell.

Contrary to the above description, when the reference voltage Vref1 of data "1" is less than the reference voltage Vref0 of data "0", in the two voltage comparison circuits 31, 32, all of the driving abilities of the PMOS transistors P1 to P4 for load are made to be same in the same way as in the circuit of FIG. 8. However, the driving abilities of the NMOS transistors M1, M2, M3, M4 for input are set to the relationship of M4>M2=M3>M1.

Next, a logic level decision circuit according to a seventh embodiment of the present invention will be described.

The circuit structure of the logic level decision circuit according to the seventh embodiment is the same as the current input type circuit shown in FIG. 9. However, as compared with the current input type logic level decision circuit shown in FIG. 9, the reference voltages Iref1, Iref0 are set as follows in order to increase the operation margin.

That is to say, when the reference current Iref1 of data "1" is greater than the reference current Iref0 of data "0", in the two voltage comparison circuits 43, 44, all of the driving abilities of the NMOS transistors N1 to N4 for load are made to be the same in the same way as in the circuit of FIG. 9. However, the driving abilities of the PMOS transistors M1, M2, M3, M4, M5, M6, M7 for input are set to the relationship of M4>M1=M2=M3=M6=M7>M5. The degree of the difference of the driving abilities is determined in accordance with the distribution state of the reference cell of data "1" and the "1" of the data cell, and the distribution state of the reference cell of data "0" and the "0" of the data cell.

In contrast to the above, when the reference current Iref1 of data "1" is less than the reference current Iref0 of data "0", in the two voltage comparison circuits 43, 44, all of the driving abilities of the NMOS transistors N1 to N4 for load are made to be the same in the same way as in the circuit of FIG. 9. However, the driving abilities of the PMOS transistors M1, M2, M3, M4, M5, M6, M7 for input are set to the relationship of M5>M1=M2=M3=M6=M7>M4.

Next, an embodiment of a case in which the present invention is applied to an MRAM having a sense amplifier circuit serving as a logic level decision circuit will be described.

Figure 12:
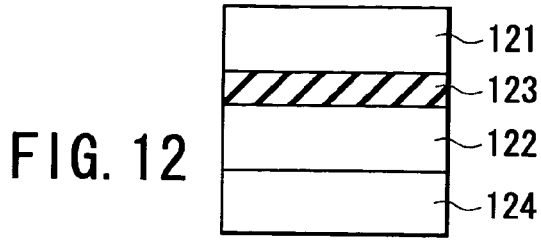
FIG. 12 is a sectional view of an MTJ element used in an MRAM.

FIG. 12 schematically shows a cross-sectional structure of an MTJ element used for the MRAM.

The MTJ element has a structure in which one non-magnetic layer (tunnel barrier film) 123 is sandwiched by two magnetic layers (ferromagnetic layer, ferromagnetic body film) 121, 122. Further, the MTJ element stores "1"/"0" information in accordance with whether the directions of magnetization of the two magnetic layers 121, 122 are parallel or inversely parallel.

Usually, a non-ferromagnetic layer 124 is disposed at one side of the two magnetic layers 121, 122. The non-ferromagnetic layer 124 is a member for easily rewriting the information by changing only the direction of magnetization of the magnetic layer 121 at the other side, due to the direction of magnetization of the magnetic layer 122 at one side being fixed. Here, the magnetic layer 121 at the magnetization variable side is called a free layer or a recording layer, and the magnetic layer 122 at the magnetization fixed side is called a fixed layer or a pin layer.

Figure 13A:
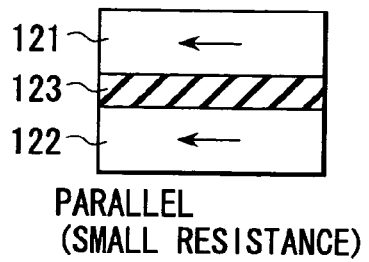
FIG. 13A and FIG. 13B are diagrams showing two states of the directions of magnetization of two magnetic layers of the MTJ element of FIG. 12.
Figure 13B:
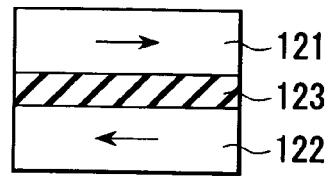

FIG. 13A and FIG. 13B show two states of the directions of magnetization of the two magnetic layers 121, 122 of the MTJ element shown in FIG. 12.

As shown in FIG. 13A, when the directions of magnetization (the directions of the arrows shown in the drawing) of the two magnetic layers 121, 122 is parallel, i.e., the same direction, the tunnel resistance of the tunnel barrier film 123 becomes the minimum. That is to say, the tunnel current becomes the maximum.

As shown in FIG. 13B, when the directions of magnetization of the two magnetic layers 121, 122 is inversely parallel, the tunnel resistance of the tunnel barrier film 123 becomes the maximum. That is to say, the tunnel current becomes the minimum.

In the MRAM, the two states in which the value of resistance of the MTJ element is different are made to correspond to a state for storing "1" information ("1" state) and a state for storing "0" information ("0" state).

Figure 14:
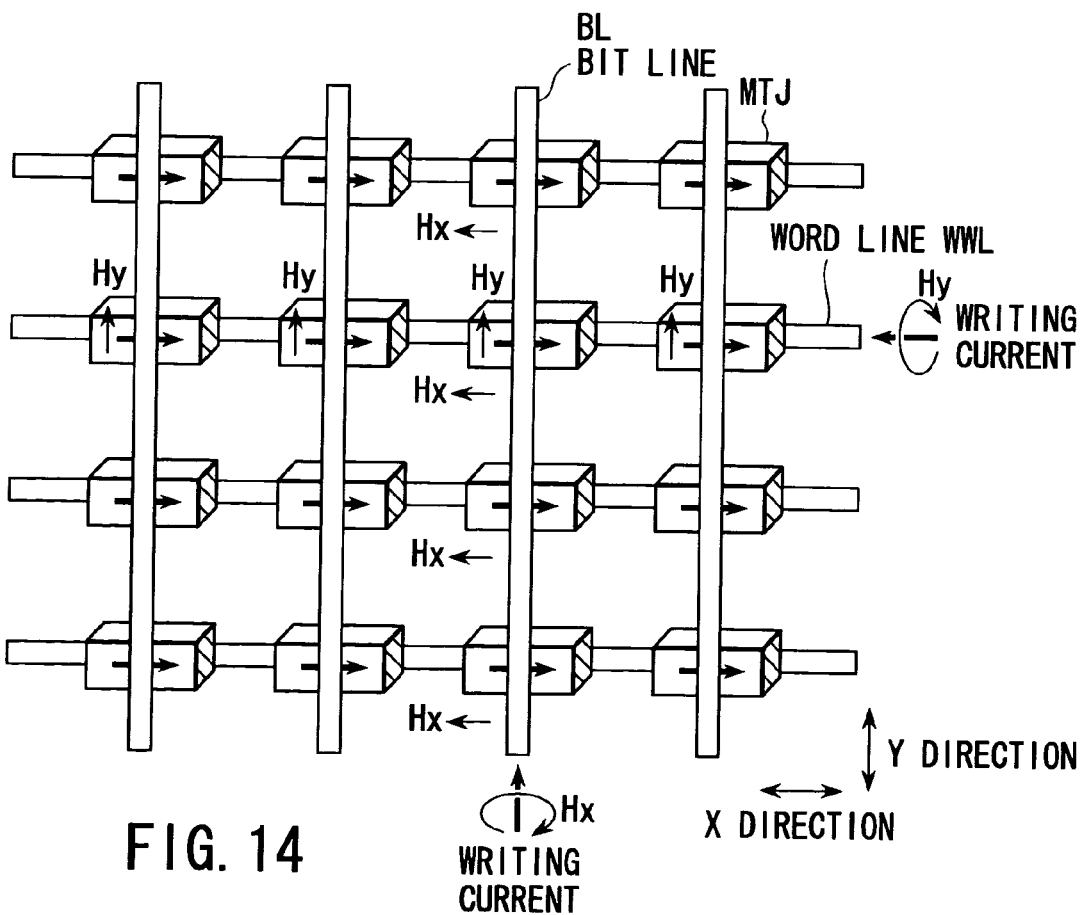
FIG. 14 is a diagram typically showing one example of a plane view layout of cell arrays of the MRAM.

FIG. 14 shows one example of the plan view layout of the cell array of the MRAM.

A plurality of bit lines BL for writing/reading and a plurality of writing word lines WWL are disposed in orthogonal directions, and the MTJ elements are disposed so as to correspond to the respective intersections. In the MTJ element, the long side of the rectangle is along the writing word line WWL, and the short side thereof is along the bit line BL, and the easy-axis direction is provided so as to be along the long side. The respective bit lines BL are connected to the respective fixed layers of the plurality of MTJ elements of the same line (or column), and are disposed so as to be closely face the respective free layers of the plurality of MTJ elements of the same row (or line).

Figure 15:
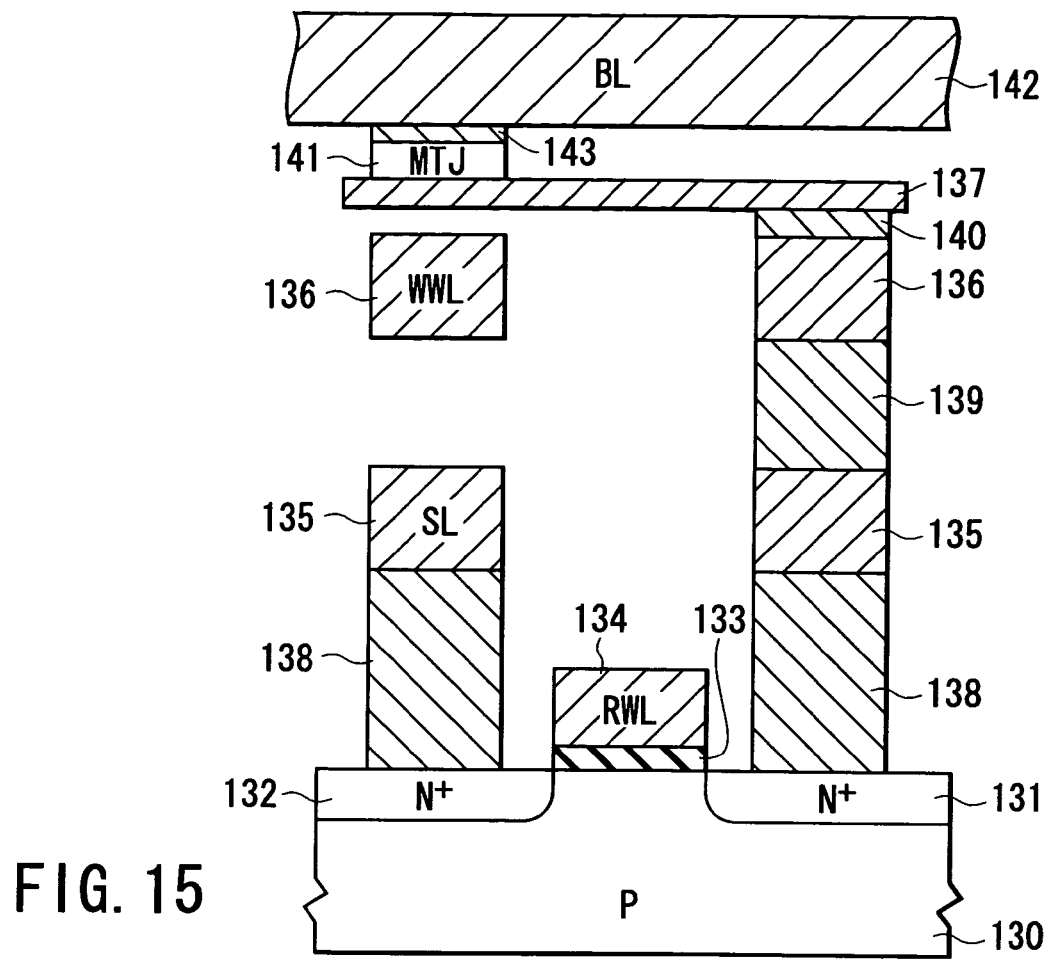
FIG. 15 is a sectional view showing one example of the structure, focusing on one memory cell in a cross-section perpendicular to a writing word line of FIG. 14.

FIG. 15 is a sectional view showing one example of a structure, focusing on one memory cell, in a cross-section perpendicular to the writing word line when the memory cell is structured by respectively connecting cell selecting transistors for reading (NMOSFET) serially to the respective MTJ elements of FIG. 14.

In FIG. 15, an impurity diffusion layer (N+) which becomes a drain region 131 or a source region 132 of the NMOSFET is selectively formed at the surface region of a semiconductor substrate (for example, a p type Si substrate) 130, and a gate electrode 134 is formed on the channel region via a gate oxide film 133. Reference numeral 135 is a first metal wiring layer, and reference numeral 136 is a second metal wiring layer, reference numeral 137 is an MTJ connecting wiring formed from a third metal wiring layer, reference numeral 138 is a contact for electrically connecting the first metal wiring layer 135 to the impurity diffusion layers (N+) 131, 132, reference numeral 139 is a contact for electrically connecting the second metal wiring layer 136 to the first metal wiring layer 135, reference numeral 140 is a contact for electrically connecting the third metal wiring layer 137 to the second metal wiring layer 136, reference numeral 141 is an MTJ element, reference numeral 142 is a fourth wiring layer, and reference numeral 143 is a contact for electrically connecting the fourth metal wiring layer 142 to the MTJ element 141. Note that an inter layer dielectric is formed between the wiring layers.

Note that, in the figure, as the applications of the wires, BL expresses a bit line for writing/reading, and WWL expresses a writing word line, and SL expresses a source line, and RWL expresses a reading word line, and the source line SL is connected to the earthed potential.

Next, the principles of the writing operation with respect to the MTJ element will be described with reference to FIG. 14 and FIG. 15.

Writing to the MTJ element is achieved by making current flow at the writing word line WWL and the bit line BL, and making the direction of magnetization of the MTJ element to be parallel or inversely parallel by using an electric field prepared by the current flowing at the both wires.

That is to say, when the information is written to the MTJ element, the information is written by using a synthesized electric field due to an electric field Hx being generated by making current flowing toward a first direction or a second direction which is opposite thereto in accordance with the writing data flow at the bit line BL, and due to an electric field Hy being generated by making only current flowing toward a given direction at the writing word line WWL. At this time, if the current flowing toward the first direction is made to flow at the bit line BL, the directions of the magnetization of the MTJ element become parallel, and if the current flowing toward the second direction is made to flow at the bit line BL, the directions of magnetization of the MTJ elements become inversely parallel.

When the information is read from the MTJ element, the reading word line RWL is activated, and only the switching elements connected to the selected MTJ elements are made to be in an ON-state and the current paths are prepared, and current is made to flow from the selected bit line to the ground potential. As a result, because a current corresponding to the value of resistance thereof flows only at the selected MTJ element, the information can be read by detecting the current value.

Next, the mechanism of changing the direction of magnetization of the MTJ element will be simply described with reference to FIG. 16 and FIG. 17.

Figure 16:
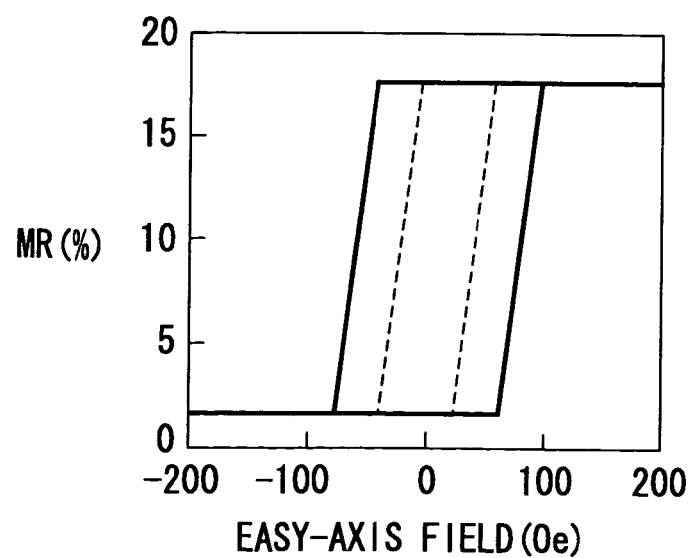
FIG. 16 is a graph showing the changing characteristic of the values of resistance (MTJ curve) by inversion of the applied electric field of the MTJ element.

FIG. 16 shows the changing characteristic (MTJ curve) of the values of resistance by inversion of an applied electric field of the MTJ element. FIG. 17 shows an astroid model of the MTJ element.

As in the MTJ curve shown in FIG. 16, when the electric field Hx is applied in the easy-axis direction of the MTJ element, the value of resistance of the MTJ element varies, for example, about 20% to 40%. The rate of change is called the MR ratio as described above. Note that the MR ratio varies in accordance with the properties of the magnetic layer. Currently, MTJ elements whose MR ratio is about 50% are obtained. A synthesized electric field of the electric field Hx in the easy-axis direction and the electric field Hy in the hard-axis direction is applied to the MTJ element.

As shown by the solid line and the broken line of FIG. 16, the magnitude of the electric field Hx in the easy-axis direction required for changing the value of resistance of the MTJ element varies in accordance with the magnitude of the electric field Hy in the hard-axis direction. By utilizing this phenomenon, data can be written to only the MTJ element disposed so as to correspond to the intersection between the selected writing word line WWL and the selected bit line BL among the memory cells arranged in an array form.

Figure 17:
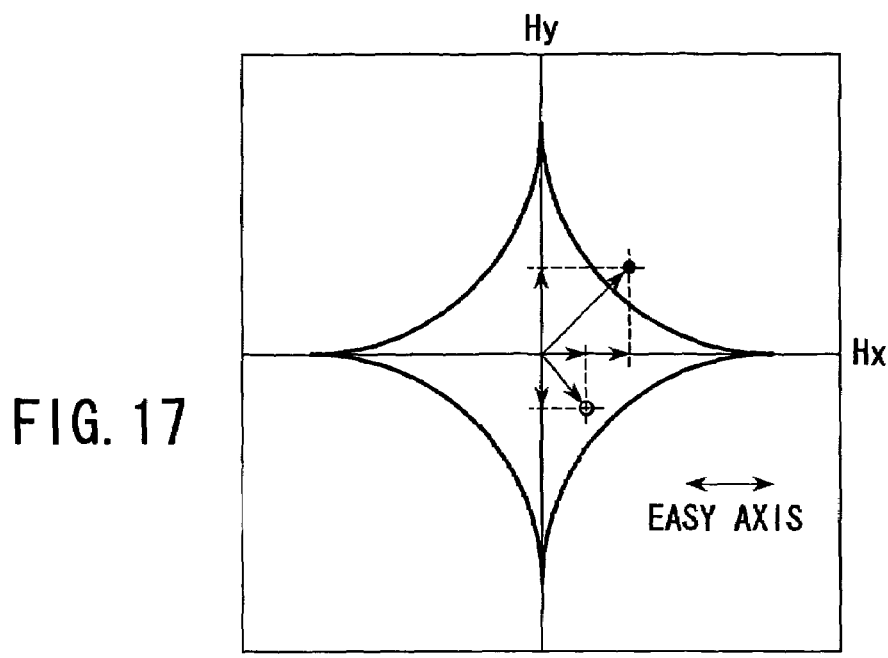
FIG. 17 is a diagram showing an astroid model of the MTJ element.

That is to say, as shown in FIG. 17, if the magnitude of the synthesized electric field of the electric field Hx in the easy-axis direction and the electric field Hy in the hard-axis direction is outside of the astroid model, for example, at the position of the black circle in the drawing, the direction of magnetization of the magnetic layer of the MTJ element can be reversed.

Conversely, if the magnitude of the synthesized electric field of the electric field Hx in the easy-axis direction and the electric field Hy in the hard-axis direction is inside of the astroid model, for example, at the position of the white circle in the drawing, the direction of magnetization of the magnetic layer of the MTJ element cannot be reversed.

Accordingly, due to the magnitude of the synthesized electric field of the electric field Hx in the easy-axis direction and the electric field Hy in the hard-axis direction being changed, and due to the position of the magnitude of the synthesized electric field in the Hx-Hy plane being changed, writing data to the MTJ element can be controlled.

Figure 18:
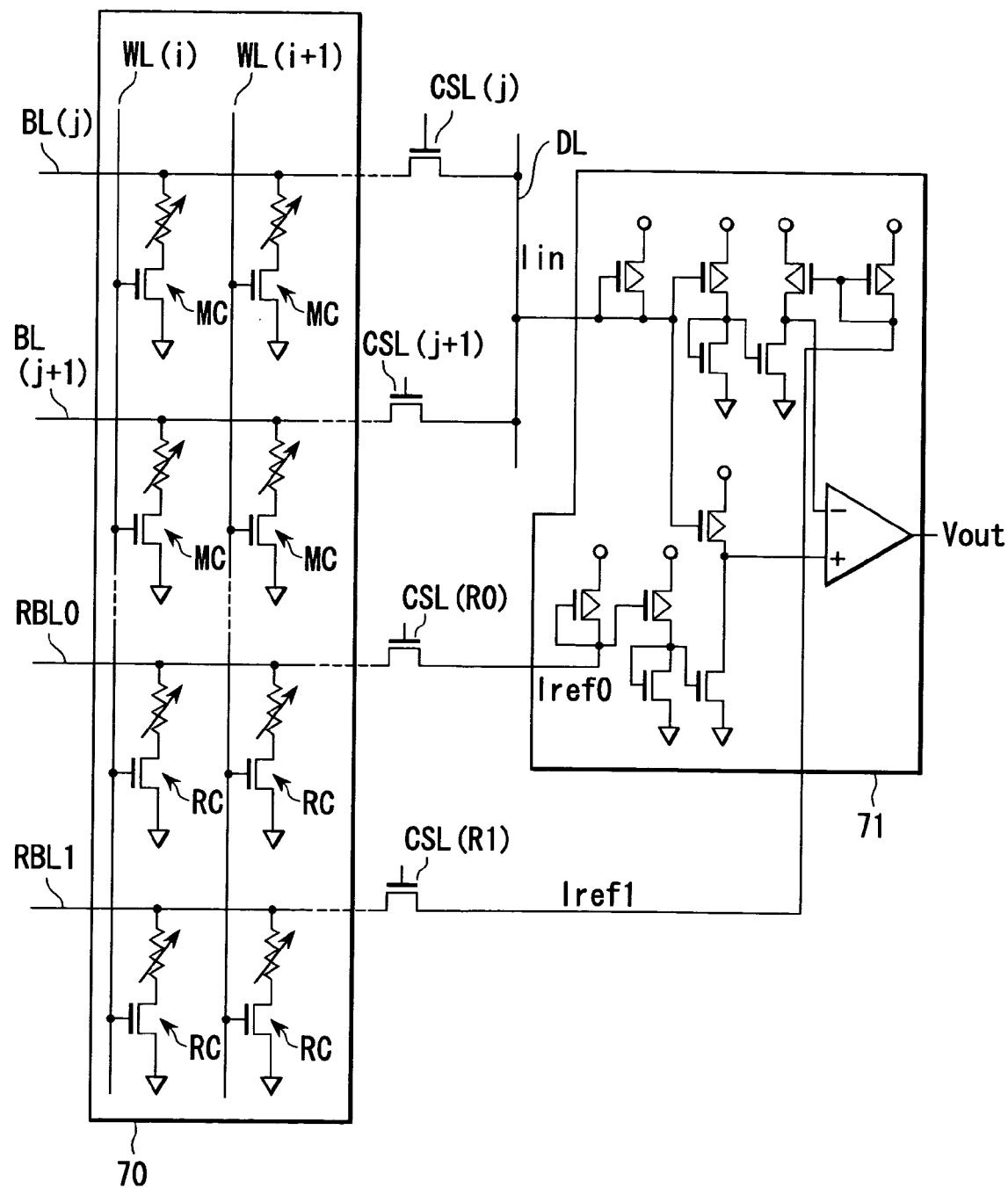
FIG. 18 is a circuit diagram showing a semiconductor memory of an eighth embodiment of the present invention.

FIG. 18 shows a structure of one portion of the MTJ-MRAM according to an eighth embodiment of the present invention. In the MTJ-MRAM of the eighth embodiment, the current input type logic level decision circuit shown in FIG. 9 is used as a sense amplifier circuit.

In FIG. 18, reference numeral 70 is a memory cell array, and reference numeral 71 is a sense amplifier circuit having the same structure as the logic level decision circuit shown in FIG. 9. In the memory cell array 70, a plurality of 1MTJ-1Tr type memory cells MC in which one MTJ element and one NMOS transistor for reading are respectively connected in series, and a plurality of reference cells RC are disposed in matrix form. A plurality of word lines WLi, WL(i+1), . . . are commonly connected to the gates of the respective NMOS transistors of the memory cells MC and the reference cells RC of the same line, and a plurality of bit lines BLj, BL(j+1), . . . are commonly connected to one ends of the respective MTJ elements of the memory cell MC of the same column. Further, a first reference bit line RBL1 is commonly connected to one ends of the respective MTJ elements of the reference cells RC of the logic "1" level of the same column, and a second reference bit line RBL0 is commonly connected to one ends of the respective MTJ elements of the reference cells RC of the logic "0" level of the same column.

The respective bit lines BLj, BL(j+1), . . . are collectively connected to a data line DL via NMOS transistors CSL(j), CSL(j+1), . . . for column switching which are respectively correspondingly selected by the column addresses so as to be respectively correspond thereto. The data line DL is connected to the current input node of the sense amplifier circuit 71.

Further, the first reference bit line RBL1 connected to the reference cell RC of the logic "1" level is connected to the first reference current input node of the sense amplifier circuit 71 via an NMOS transistor CSL(R1) which is set so as to be always in the selected state regardless of the column address.

Further, the second reference bit line RBL0 connected to the reference cell RC of the logic "0" level is connected to the second reference current input node of the sense amplifier circuit 71 via an NMOS transistor CSL(R0) which is set so as to be always in the selected state regardless of the column address.

In the operation of the MTJ-MRAM having the above-described structure, for example, the reading current Iin from the memory cell MC selected by the word line WLi and the bit line BLi is input to the current input node of the sense amplifier circuit 71 via the NMOS transistor CSLj and the data line DL. On the other hand, the reading currents Iref1, Iref0 from the reference cell of "1" and the reference cell of "0" of the same line as the above-described cell are respectively correspondingly connected to the first reference current input node and the second reference current input node of the sense amplifier circuit 71 via the first reference bit line RBL1 and the second reference bit line RBL0. The sense amplifier circuit 71 operates in the same way as the operation of the current input type logic level decision circuit which was described with reference to FIG. 9.

Figure 19:
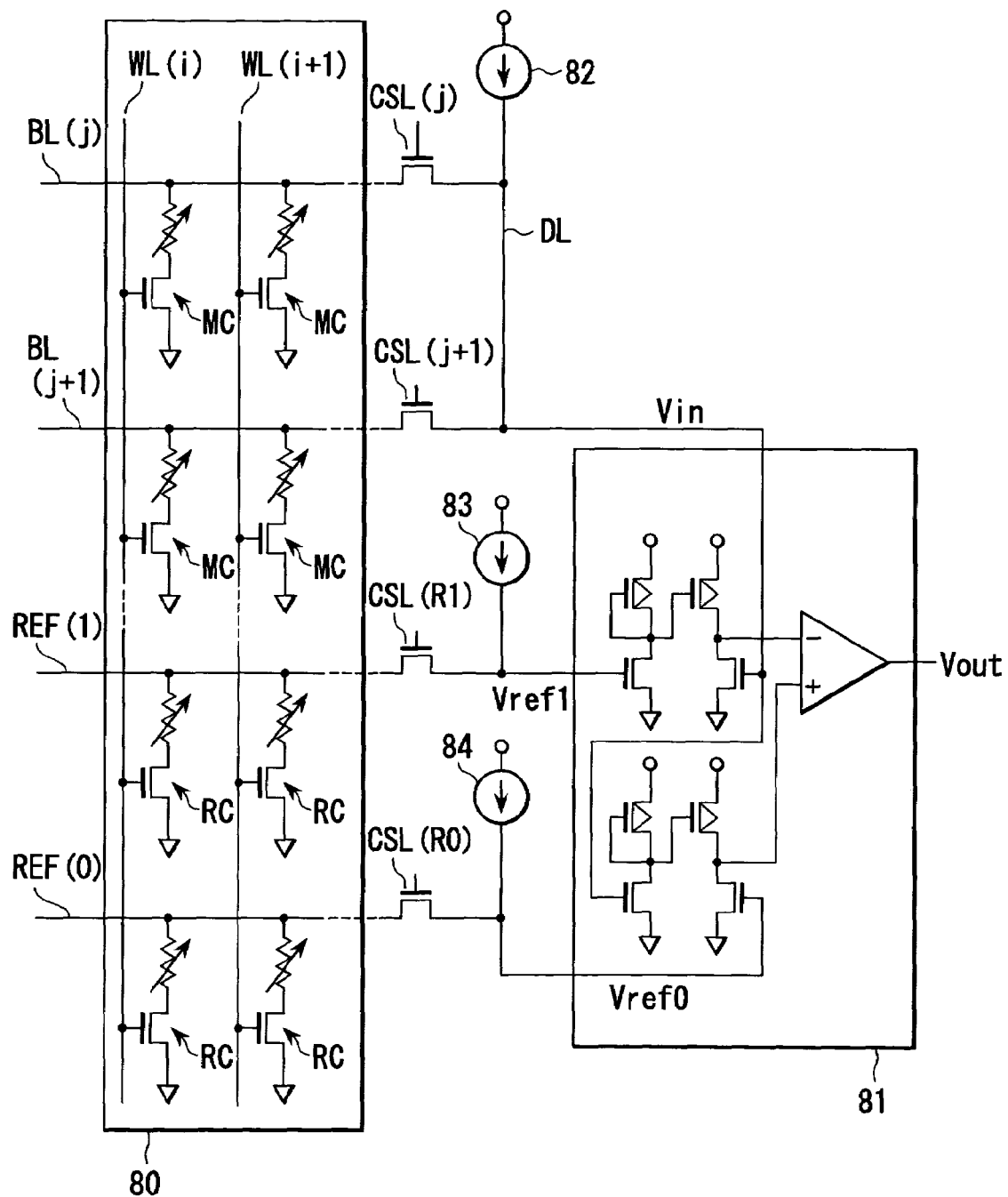
FIG. 19 is a circuit diagram showing a semiconductor memory of a ninth embodiment of the present invention.

FIG. 19 shows a structure of one portion of an MTJ-MRAM according to a ninth embodiment of the present invention. In the MTJ-MRAM of the ninth embodiment, the current input type logic level decision circuit shown in FIG. 8 is used as a sense amplifier circuit.

In FIG. 19, a memory cell array 80 is structured so as to be substantially the same as the memory cell array 70 of FIG. 18. However, the memory cell array 80 is different from the memory cell array 70 in that a current source 82 for memory cell current supplying is connected to the data line DL, and a current source 83 for reference cell current supplying is connected to one end side of the NMOS transistor CSL(R1), and a current source 84 for reference cell current supplying is connected to one end side of the NMOS transistor CSL(R0). The current amount of these current sources 82, 83, 84 are the same. Therefore, voltages corresponding to the values of resistance of the MTJ elements of the memory cells appear at the respective bit lines (BL(j), BL(j+1), . . . and REF(0), REF(1)). Further, the higher the resistances of the MTJ elements are, the higher the respective voltages become.

The voltage corresponding to the value of resistance of the MTJ element of the memory cell MC is input to the voltage input node of a sense amplifier circuit 81. Further, the voltage corresponding to the value of resistance of the MTJ element of the reference cell RC of the logic "1" level and the voltage corresponding to the value of resistance of the MTJ element of the reference cell RC of the logic "0" level are respectively correspondingly input to a first reference voltage input node and a second reference voltage input node of the sense amplifier circuit 81. The sense amplifier circuit 81 operates in the same way as the operation of the current input type logic level decision circuit which was described above with reference to FIG. 8.

Figure 20:
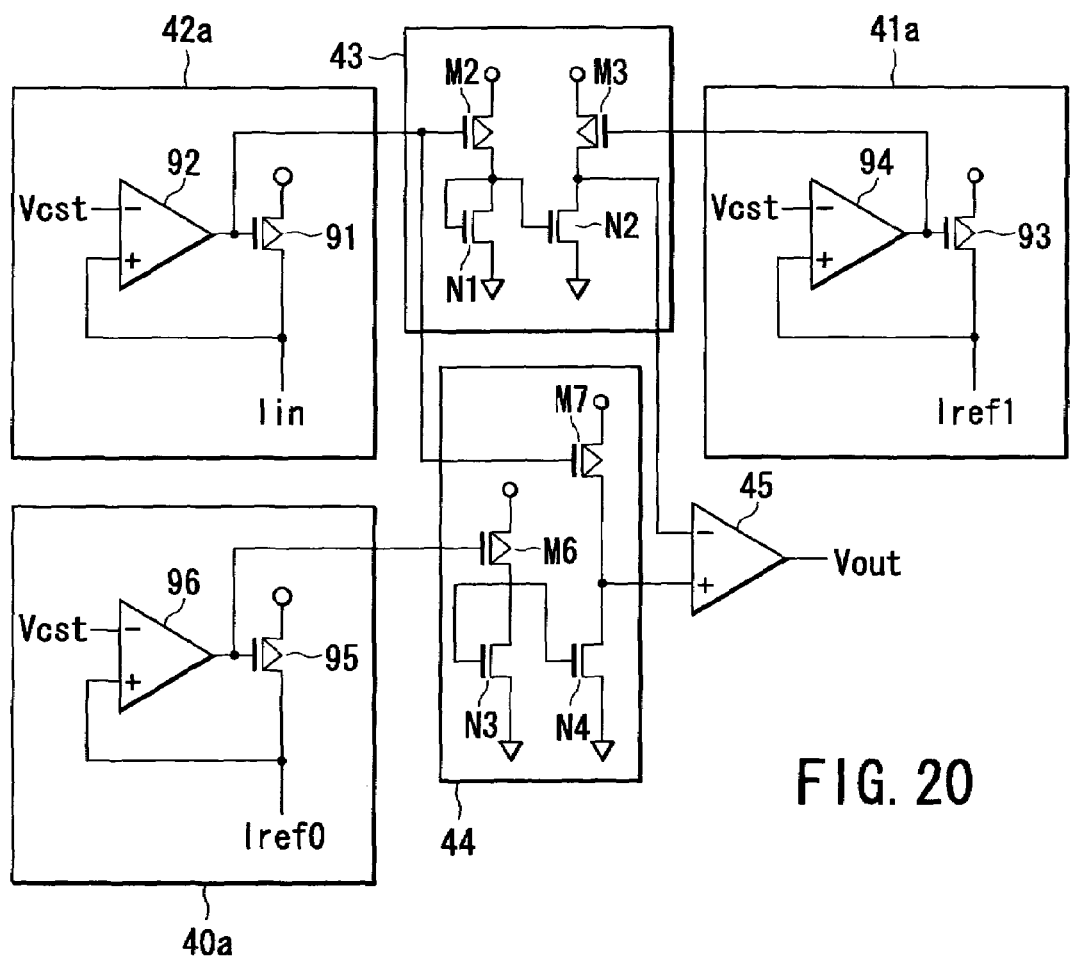
FIG. 20 is a circuit diagram of a logic level decision circuit of a tenth embodiment of the present invention.

FIG. 20 shows a structure of a logic level decision circuit according to a tenth embodiment of the present invention. The logic level decision circuit is used as a sense amplifier circuit of the MTJ-MRAM. The logic level decision circuit is a current input type case in the same way as the logic level decision circuit shown in FIG. 9. However, the logic level decision circuit is used when there are limitations to the voltage applied to the memory cell.

The logic level decision circuit is different from the logic level decision circuit shown in FIG. 9 with regard to the structures of the current input circuits 42a, 41a, 40a, and is the same as the logic level decision circuit shown in FIG. 9 with regard to the other points.

The current input circuit 42a includes a PMOS transistor 91 connected between the power source voltage node and the input node of the input signal current Iin, and an operational amplifier circuit 92 in which the non-inverting input terminal (+) thereof is connected to the input node of the Iin, and a fixed potential Vcst is applied to the inverting input terminal (−) thereof, and an output terminal thereof is connected to a gate of the PMOS transistor 91. An output potential of the operational amplifier circuit 92 is supplied to gate of the current Iin inputting PMOS transistor M2 of the current mirror type first current comparison circuit 43 and the gate of the current Iin inputting PMOS transistor M7 of the current mirror type second current comparison circuit 44.

The current input circuit 41a includes a PMOS transistor 93 connected between the power source voltage node and the input node of the reference current Iref1, and an operational amplifier circuit 94 at which a non-inverting input terminal (+) thereof is connected to the input node of the Iref1, and a fixed potential Vcst is applied to an inverting input terminal (−) thereof, and an output terminal thereof is connected to a gate of the PMOS transistor 93. An output potential of the operational amplifier circuit 94 is supplied to the gate of the Iref1 inputting PMOS transistor M3 of the first current comparison circuit 43.

The current input circuit 40a includes a PMOS transistor 95 connected between the power source voltage node and the input node of the reference current Iref0, and an operational amplifier circuit 96 at which a non-inverting input terminal (+) thereof is connected to the input node of the Iref0, and a fixed potential Vcst is applied to an inverting input terminal (−) thereof, and an output terminal thereof is connected to a gate of the PMOS transistor 95. The output potential of the operational amplifier circuit 96 is supplied to the gate of the Iref0 inputting PMOS transistor M6 of the second current comparison circuit 44.

In the logic level decision circuit having such a structure, the respective voltages of the input node of the input signal current Iin, the input node of the reference current Iref1, and the input node of the reference current Iref0 can be limited to the fixed potential Vcst by the operations of the respective operational amplifier circuits 92, 94, 96. Accordingly, by using as the fixed potential Vcst, for example, a band gap reference (BGR) potential generated in the memory, the respective voltages of the input node of the Iin, the input node of the Iref1, and the input node of the Iref0 can be limited to the band gap reference potential.

The MRAM according to the eighth and ninth embodiments of the invention may be applied in various examples. Some of the applicable examples are explained below.

APPLICABLE EXAMPLE 1

Figure 21:
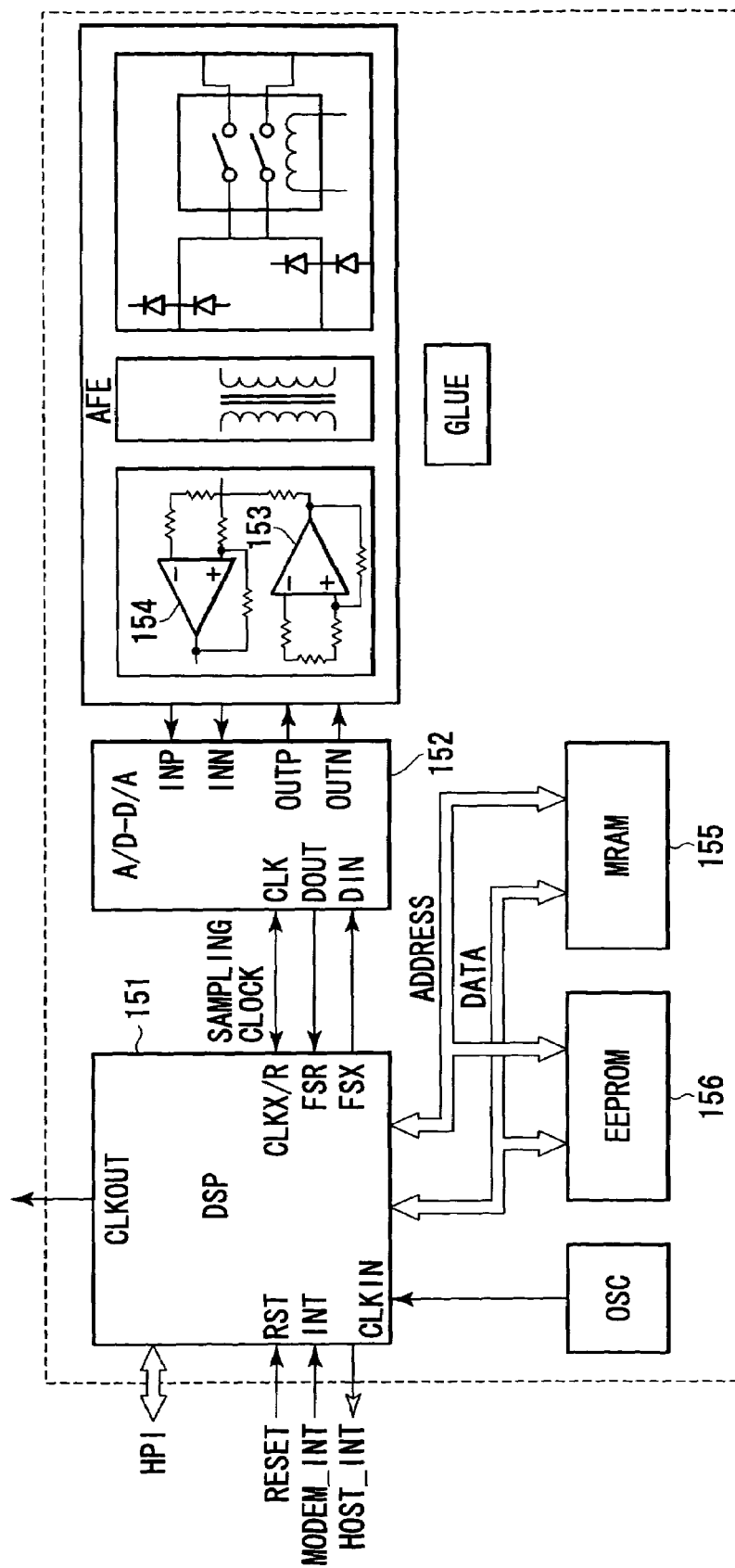
FIG. 21 is a block circuit diagram of a DSL data path portion of a digital subscriber line modem as one of application examples of MRAM.

As one of applicable examples of the MRAM, FIG. 21 shows a digital subscriber line (DSL) data path portion of a digital subscriber line (DSL) modem. This modem includes a programmable digital signal processor (DSP) 151, an analog-to-digital converter (A/D) and digital-to-analog converter (D/A) 152, a transmission driver 153, and a receiver amplifier 154. In FIG. 21, the band pass filter is omitted, and an MRAM 155 and an EEPROM 156 are shown instead as an optional memory of various types capable of holding a line code program.

In this example, as the memory for holding the line code program, two memories MRAM and EEPROM are used, but the EEPROM may be replaced by the MRAM, that is, without using two memories, only the MRAM may be used.

APPLICABLE EXAMPLE 2

Figure 22:
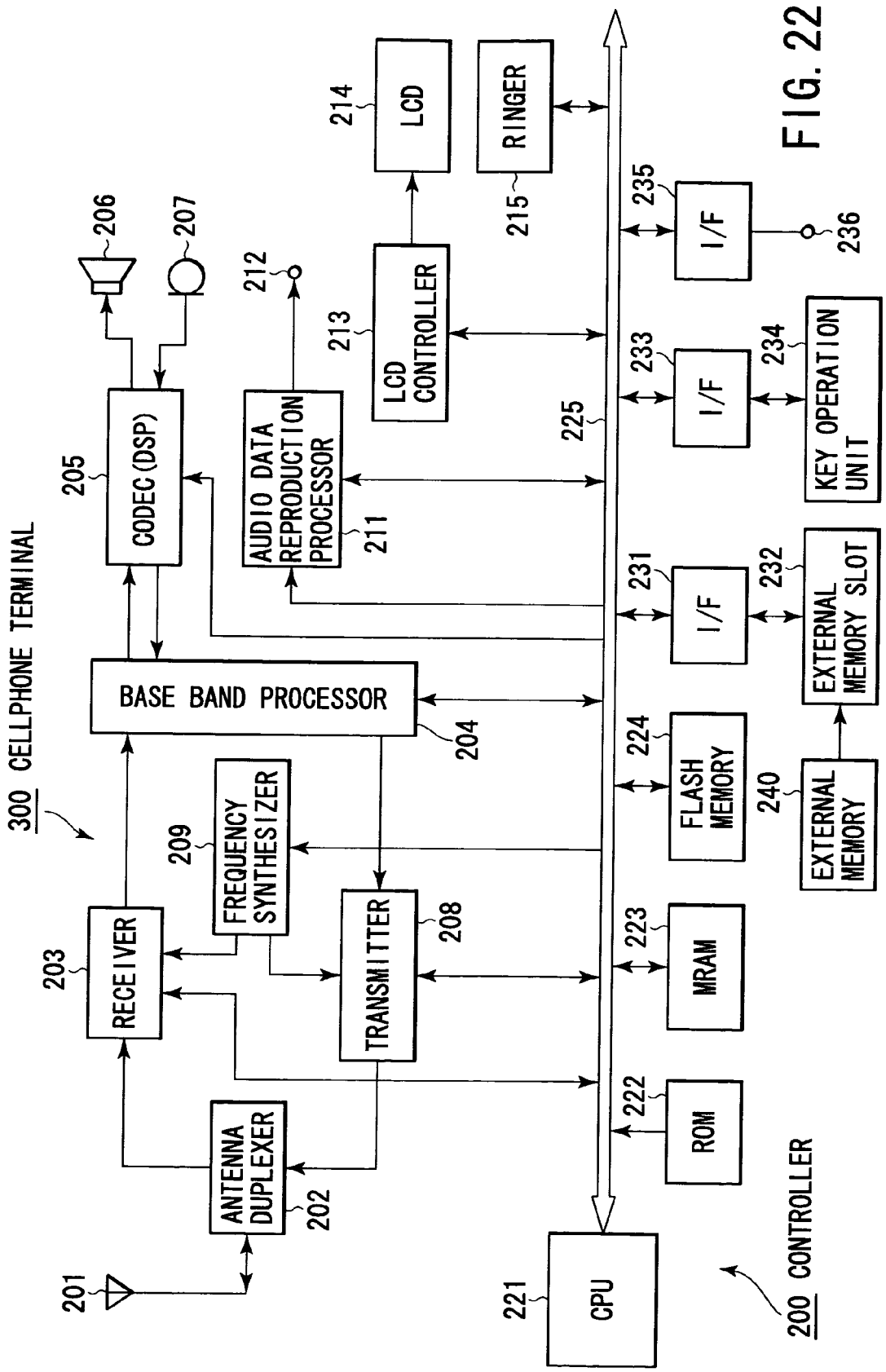
FIG. 22 is a block circuit diagram of a circuit portion for realizing communication function in a cellphone terminal as another application example of MRAM.

As another applicable example of the MRAM, FIG. 22 shows a portion for realizing communication function in a cellphone terminal 300. As shown in FIG. 22, the portion for realizing the communication function comprises a transmission and reception antenna 201, an antenna duplexer 202, a receiver 203, a base band processor 204, a digital signal processor (DSP) 205 used as audio codec, a loudspeaker 206, a microphone 207, a transmitter 208, and a frequency synthesizer 209.

Also as shown in FIG. 22, the cellphone terminal 300 has a controller 200 for controlling the parts of the cellphone terminal. The controller 200 is a microcomputer composed by connecting a CPU 221, a ROM 222, an MRAM 223, and a flash memory 224 by way of a CPU bus 225.

Herein, the ROM 222 preliminarily stores programs to be executed in the CPU 221, and necessary data such as display font. The MRAM 223 is mainly used as a working region, and specifically it is used when storing necessary data in the midst of calculation as required during program execution by the CPU 221, or when temporarily storing data to be used in communications between the controller 200 and other parts. The flash memory 224 stores the immediate preceding setting conditions or the like even if the power source of the cellphone terminal 300 is turned off, or stores the setting parameters when using by setting in the same conditions when the power source is turned on again. That is, the flash memory 224 is a nonvolatile memory holding the stored data even if the power source of the cellphone terminal is turned off.

In this example, the ROM 222, MRAM 223, and flash memory 224 are used, but the flash memory 224 may be replaced by the MRAM, or the ROM 222 may be also replaced by the MRAM.

In FIG. 22, reference numeral 211 is an audio data reproduction processor, 212 is an external terminal connected to the audio data reproduction processor 211, 213 is an LCD controller, 214 is an LCD connected to the LCD controller 213, 215 is a ringer, 231 is an interface (I/F) provided between a CPU bus 225 and an external memory slot 232, 233 is an interface (I/F) provided between the CPU bus 225 and a key operation unit 234, 235 is an interface (I/F) provided between the CPU bus 225 and an external terminal 236, and an external memory 240 is inserted into the external memory slot 232.

APPLICABLE EXAMPLE 3

FIGS. 23 to 27 show an example in which the MRAM is applied in a card holding media contents such as smart media (MRAM card).

Figure 23:
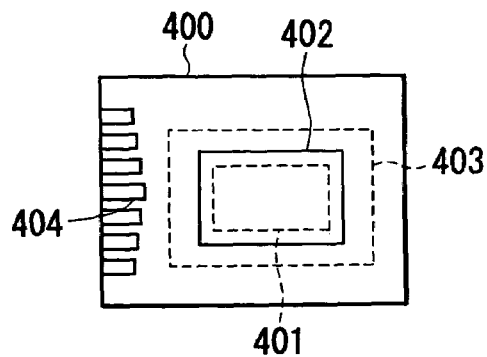
FIG. 23 is a top view showing an example in which the MRAM is applied to an MRAM card.

In a top view in FIG. 23, reference numeral 400 is an MRAM card main body, 401 is an MRAM chip, 402 is an opening, 403 is a shutter, and 404 denotes plural external terminals. The MRAM chip 401 is contained in the MRAM card main body 400, and is exposed to outside through the opening 402. While carrying the MRAM card, the MRAM chip 401 is covered with the shutter 403. The shutter 403 is made of a material having an effect of shielding an external magnetic field, such as ceramic material. When transferring the data, the shutter 403 is released, and the MRAM chip 401 is exposed. The external terminals 404 are for taking out the contents data stored in the MRAM card to outside.

Figure 24:
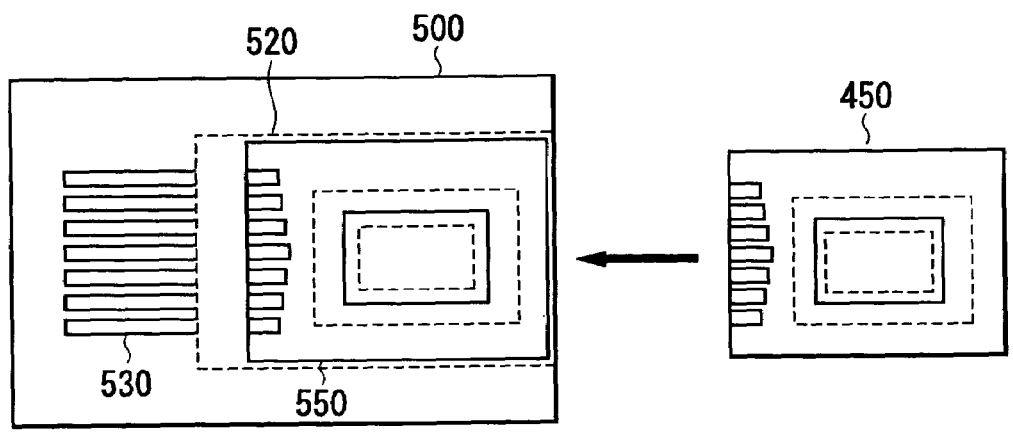
FIG. 24 is a top view of a transfer device of card insert type for transferring data on the MRAM card in FIG. 23.

FIGS. 24 and 25 are a top view and a side view of a transfer device of card insert type for transferring data on the MRAM card. A second MRAM card 450 used by an end user is inserted from a slit 510 in a transfer device 500, and pushed in until stopped by a stopper 520. The stopper 520 is also used as a member for positioning the first MRAM card 550 and second MRAM card 450. With the second MRAM card 450 disposed at specified position, the data stored in the first MRAM card 550 is transferred into the second MRAM card 450.

Figure 26:
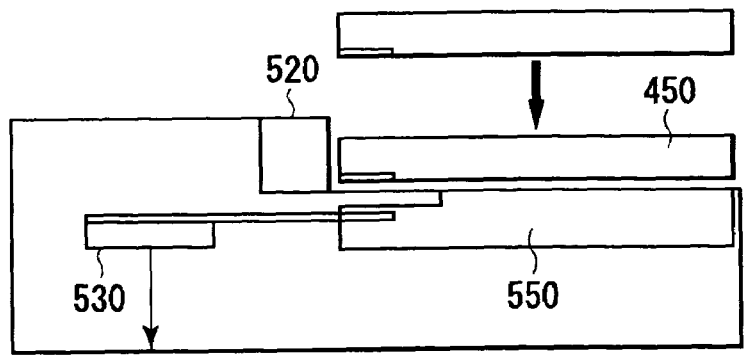
FIG. 26 is a side view of a transfer device of fit-in type for transferring data on the MRAM card in FIG. 23.

FIG. 26 is a side view of a transfer device of fit-in type. As indicated by arrow in the drawing, in this type, aiming at the stopper 520, the second MRAM card 450 is fitted on the first MRAM card 550. The transfer method is same as that in the cart insert type, and explanation is omitted.

FIG. 27 is a side view of a transfer device of slide type. In the same manner as in the CD-ROM drive or DVD drive, a receiving tray slide 560 is provided in the transfer device 500, and this receiving tray slide 560 slides in the horizontal direction as indicated by arrow in the drawing. When the receiving tray slide 560 moves to the state indicated by the broken line in the drawing, the second MRAM card 450 is put on the receiving tray slide 560. Then, the receiving tray slide 560 conveys the second MRAM card 450 into the inside of the transfer device 500. The second MRAM card 450 is conveyed until its leading end hits against the stopper 520, and the data is transferred, same as in the card insert type, and explanation is omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor apparatus having a logic level decision circuit, the logic level decision circuit comprising:
   a first comparison circuit which compares an input signal with a first reference signal corresponding to logic "1" level, and which outputs a first differential signal;
   a second comparison circuit which compares the input signal with a second reference signal corresponding to logic "0" level, and which outputs a second differential signal; and
   a third comparison circuit which compares the output of the first comparison circuit and the output of the second comparison circuit, and which decides a logic level of the input signal,
   wherein the logic level decision circuit is a voltage input type logic level decision circuit; and
   the first comparison circuit is a current mirror type first voltage comparison circuit, and the second comparison circuit is a current mirror type second voltage comparison circuit.

2. A semiconductor apparatus according to claim 1, wherein
   the first and second voltage comparison circuits each have a pair of transistors for load and a pair of transistors for input,
   the respective driving abilities of the pair of transistors for load of the respective first and second voltage comparison circuits are set so as to be the same, and
   the driving abilities of the pair of transistors for input of the first voltage comparison circuit and the pair of transistors for input of the second voltage comparison circuit corresponding thereto are set so as to differ in accordance with a relationship of magnitudes of the signal level of the first reference signal and the signal level of the second reference signal.

3. A semiconductor apparatus according to claim 2, wherein
   the signal level of the first reference signal is greater than the signal level of the second reference signal,
   among the pair of transistors for input of the first voltage comparison circuit, the driving ability of the transistor at which the first reference signal is input to a gate thereof is M1, and the driving ability of the transistor at which the input signal is input to a gate thereof is M2, and
   among the pair of transistors for input of the second voltage comparison circuit, the driving ability of the transistor at which the input signal is input to a gate thereof is M3, and the driving ability of the transistor at which the second reference signal is input to a gate thereof is M4,
   a relationship M1>M2=M3>M4 is established among the driving forces M1 to M4.

4. A semiconductor apparatus according to claim 2, wherein
   the signal level of the second reference signal is greater than the signal level of the first reference signal,
   among the pair of transistors for input of the first voltage comparison circuit, the driving ability of the transistor at which the first reference signal is input to a gate thereof is M1, and the driving ability of the transistor at which the input signal is input to a gate thereof is M2, and
   among the pair of transistors for input of the second voltage comparison circuit, the driving ability of the transistor at which the input signal is input to a gate thereof is M3, and the driving ability of the transistor at which the second reference signal is input to a gate thereof is M4,
   a relationship M4>M2=M3>M1 is established among the driving forces M1 to M4.

5. A semiconductor apparatus having a logic level decision circuit, the logic level decision circuit comprising:
   a first comparison circuit which compares an input signal with a first reference signal corresponding to logic "1" level, and which outputs a first differential signal;
   a second comparison circuit which compares the input signal with a second reference signal corresponding to logic "0" level, and which outputs a second differential signal; and
   a third comparison circuit which compares the output of the first comparison circuit and the output of the second comparison circuit, and which decides a logic level of the input signal,
   wherein the logic level decision circuit is a current input type logic level decision circuit; and
   the first comparison circuit is a current mirror type first current comparison circuit, and the second comparison circuit is a current mirror type second current comparison circuit.

6. A semiconductor apparatus according to claim 5, wherein
   the first and second current comparison circuits each have a pair of transistors for load and a pair of transistors for input,
   the respective driving abilities of the pair of transistors for load of the respective first and second current comparison circuits are set so as to be the same, and
   the driving abilities of the pair of transistors for input of the first current comparison circuit and the pair of transistors for input of the second current comparison circuit corresponding thereto are set so as to differ in accordance with a relationship of magnitudes of the signal level of the first reference signal and the signal level of the second reference signal.

7. A semiconductor apparatus according to claim 6, wherein
   the signal level of the first reference signal is greater than the signal level of the second reference signal,
   among the pair of transistors for input of the first current comparison circuit, the driving ability of the transistor at which current corresponding to the current of the input signal flows is M2, and the driving ability of the transistor at which current corresponding to the current of the first reference signal flows is M3, and
   among the pair of transistors for input of the second current comparison circuit, the driving ability of the transistor at which current corresponding to the current of the second reference signal flows is M6, and the driving ability of the transistor at which current corresponding to the current of the input signal flows is M7,
   a relationship M3>M2=M7>M6 is established among the driving forces M2, M3, M6, and M7.

8. A semiconductor apparatus according to claim 6, wherein
   the signal level of the second reference signal is greater than the signal level of the first reference signal, and
   among the pair of transistors for input of the first current comparison circuit, the driving ability of the transistor at which current corresponding to the current of the input signal flows is M2, and the driving ability of the transistor at which current corresponding to the current of the first reference signal flows is M3, and among the pair of transistors for input of the second current comparison circuit, the driving ability of the transistor at which current corresponding to the current of the second reference signal flows is M6, and the driving ability of the transistor at which current corresponding to the current of the input signal flows is M7, a relationship M6>M2=M7>M5 is established among the driving forces M2, M3, M6, and M7.

* * * * *